United States Patent
Kubota et al.

(10) Patent No.: US 10,340,344 B2
(45) Date of Patent: Jul. 2, 2019

(54) SILICON CARBIDE SEMICONDUCTOR DEVICE AND METHOD FOR MANUFACTURING THE SAME

(71) Applicants: Sumitomo Electric Industries, Ltd., Osaka-shi (JP); Renesas Electronics Corporation, Tokyo (JP)

(72) Inventors: Ryosuke Kubota, Osaka (JP); Shunsuke Yamada, Osaka (JP); Taku Horii, Osaka (JP); Takeyoshi Masuda, Osaka (JP); Daisuke Hamajima, Osaka (JP); So Tanaka, Osaka (JP); Shinji Kimura, Tokyo (JP); Masayuki Kobayashi, Hitachinaka (JP)

(73) Assignees: Sumitomo Electric Industries, Ltd., Osaka-shi (JP); Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/870,289

(22) Filed: Jan. 12, 2018

(65) Prior Publication Data
US 2018/0138275 A1    May 17, 2018

Related U.S. Application Data

(62) Division of application No. 15/035,184, filed as application No. PCT/JP2014/074710 on Sep. 18, 2014, now Pat. No. 9,905,653.

(30) Foreign Application Priority Data

Nov. 8, 2013   (JP) .................................. 2013-232369
Feb. 27, 2014  (JP) .................................. 2014-036900

(51) Int. Cl.
    *H01L 29/16*    (2006.01)
    *H01L 21/66*    (2006.01)
    (Continued)

(52) U.S. Cl.
    CPC ...... *H01L 29/1608* (2013.01); *G01R 31/2856* (2013.01); *H01L 21/049* (2013.01);
    (Continued)

(58) Field of Classification Search
    CPC .................................................... H01L 29/1608
    See application file for complete search history.

(56) References Cited

U.S. PATENT DOCUMENTS

2001/0000113 A1   4/2001 Kito
2007/0243722 A1   10/2007 Nakamura et al.
(Continued)

FOREIGN PATENT DOCUMENTS

CN    101060081 A    10/2007
CN    101512727 A    8/2009
(Continued)

OTHER PUBLICATIONS

Mitsuo Okamoto et al., "Reduction of Instability in the Vth of 4H—SiC Carbon Face MOSFETs," Proceedings of the 59th Spring Meeting of The Japan Society of Applied Physics and Related Societies, 2012, Waseda University, pp. 15-309 [Cited in Parent].
(Continued)

*Primary Examiner* — Eugene Lee
(74) *Attorney, Agent, or Firm* — Baker Botts L.L.P.; Michael A. Sartori

(57) ABSTRACT

A silicon carbide semiconductor device includes a silicon carbide substrate, a gate insulating film, and a gate electrode. The gate insulating film is provided as being in contact with the first main surface of the silicon carbide substrate. The gate electrode is provided on the gate insulating film such that the gate insulating film lies between the gate electrode and the silicon carbide substrate. In a first stress test in which a gate voltage of −5 V is applied to the gate electrode for 100 hours at a temperature of 175° C., an absolute value of a
(Continued)

difference between a first threshold voltage and a second threshold voltage is not more than 0.5 V, with a threshold voltage before the first stress test being defined as the first threshold voltage and a threshold voltage after the first stress test being defined as the second threshold voltage.

16 Claims, 13 Drawing Sheets

(51) Int. Cl.

| | | |
|---|---|---|
| *H01L 21/04* | (2006.01) | |
| *H01L 29/66* | (2006.01) | |
| *H01L 29/78* | (2006.01) | |
| *H01L 21/28* | (2006.01) | |
| *H01L 29/423* | (2006.01) | |
| *H01L 29/49* | (2006.01) | |
| *H01L 29/12* | (2006.01) | |
| *G01R 31/28* | (2006.01) | |
| *H01L 21/321* | (2006.01) | |
| *H01L 21/324* | (2006.01) | |
| *H01L 21/326* | (2006.01) | |
| *H01L 29/45* | (2006.01) | |
| *H01L 29/51* | (2006.01) | |
| *G01R 31/26* | (2014.01) | |

(52) U.S. Cl.
CPC .......... *H01L 21/0485* (2013.01); *H01L 21/28* (2013.01); *H01L 21/321* (2013.01); *H01L 21/324* (2013.01); *H01L 21/326* (2013.01); *H01L 22/14* (2013.01); *H01L 29/12* (2013.01); *H01L 29/423* (2013.01); *H01L 29/45* (2013.01); *H01L 29/49* (2013.01); *H01L 29/51* (2013.01); *H01L 29/66068* (2013.01); *H01L 29/78* (2013.01); *H01L 29/7827* (2013.01); *G01R 31/2621* (2013.01)

(56) References Cited

U.S. PATENT DOCUMENTS

| | | |
|---|---|---|
| 2009/0159876 A1 | 6/2009 | Ohba et al. |
| 2010/0006860 A1 | 1/2010 | Roedle et al. |
| 2010/0221917 A1 | 9/2010 | Masuda |
| 2011/0227150 A1 | 9/2011 | Horita |
| 2012/0276715 A1 | 11/2012 | Hori et al. |
| 2013/0020585 A1 | 1/2013 | Ishibashi |
| 2014/0252376 A1* | 9/2014 | Itoh ............... H01L 29/1608 257/77 |
| 2015/0084013 A1 | 3/2015 | Ohmi |
| 2015/0102361 A1 | 4/2015 | Pala et al. |
| 2017/0335489 A1* | 11/2017 | Honke ............... B24B 37/00 |
| 2018/0114843 A1* | 4/2018 | Saitoh ............... H01L 21/046 |

FOREIGN PATENT DOCUMENTS

| | | |
|---|---|---|
| JP | S62-032648 A | 2/1987 |
| JP | H11-330090 A | 11/1999 |
| JP | H11-345964 A | 12/1999 |
| JP | 2006-222210 A | 8/2006 |
| JP | 2007-287992 A | 11/2007 |
| JP | 2010-502031 A | 1/2010 |
| JP | 2011-199060 A | 10/2011 |
| JP | 2013-175593 A | 9/2013 |
| WO | 2007/086196 A1 | 8/2007 |

OTHER PUBLICATIONS

International Search Report in PCT International Application No. PCT/JP2014/074710, dated Dec. 16, 2014. [Cited in Parent].
Notification of First Office Action issued in counterpart Chinese Patent Application No. 201480061004.9 dated Mar. 27, 2018.
Office Action in counterpart Japanese Patent Application No. 2018-021266, dated Jan. 8, 2019, 3 pages.
English Translation of Office Action in counterpart Japanese Patent Application No. 2018-021266, dated Jan. 8, 2019, 3 pages.

* cited by examiner

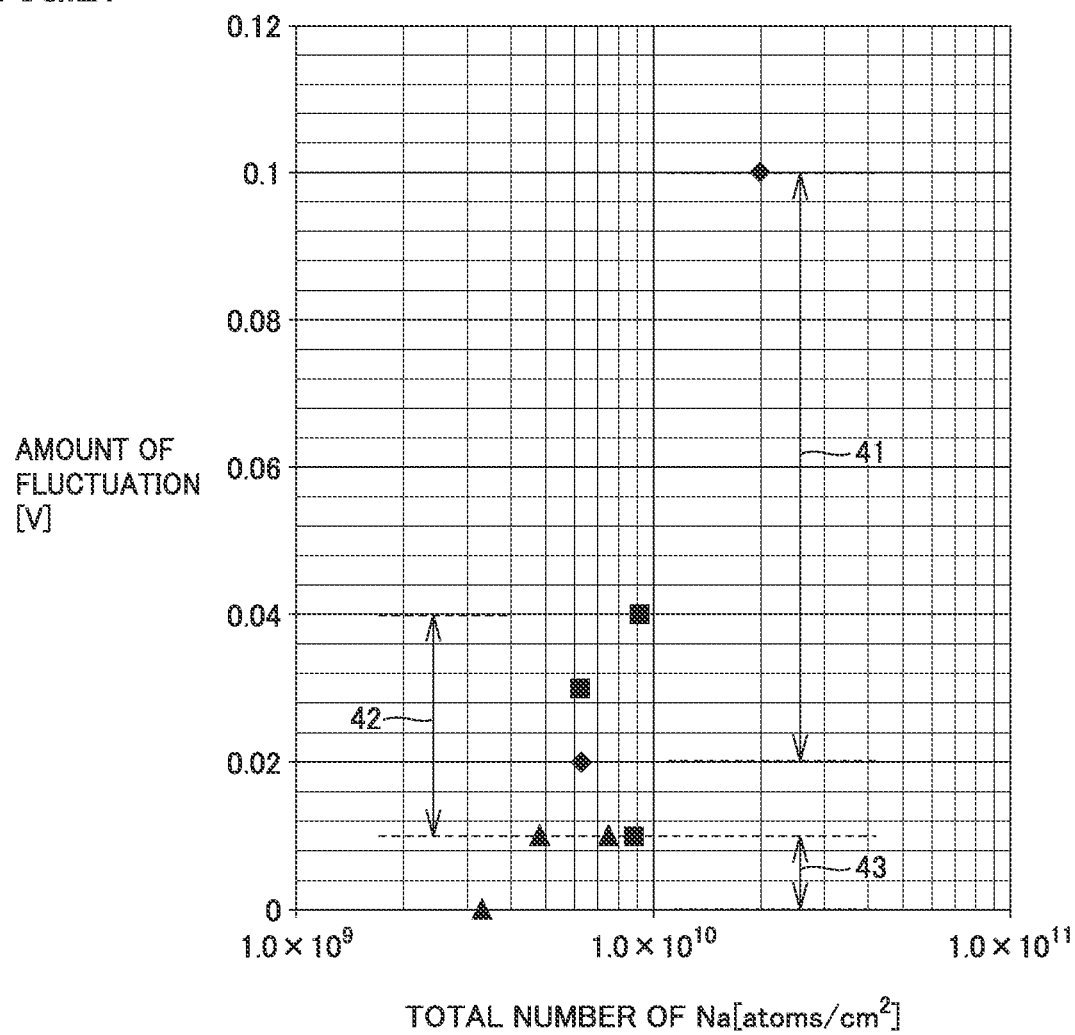

SILICON CARBIDE SEMICONDUCTOR DEVICE AND METHOD FOR MANUFACTURING THE SAME

CROSS-REFERENCE TO RELATED APPLICATIONS

This application is a Divisional of U.S. patent application Ser. No. 15/035,184, filed May 6, 2016, which is a 371 application of International Application No. PCT/JP2014/074710, filed Sep. 18, 2014, which claims the benefit of Japanese Patent Application Nos. 2013-232369, filed Nov. 8, 2013 and 2014-036900, filed Feb. 27, 2014.

TECHNICAL FIELD

This invention relates to a silicon carbide semiconductor device and a method for manufacturing the same and particularly to a silicon carbide semiconductor device in which fluctuation in threshold voltage can be lessened and a method for manufacturing the same.

BACKGROUND ART

In order to allow a semiconductor device to be high in breakdown voltage and low in loss and to be used in a high-temperature environment, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage and a lower on-resistance of a semiconductor device can be achieved. A semiconductor device in which silicon carbide has been adopted as a material is also advantageous in that lowering in characteristics during use in a high-temperature environment is less than in a semiconductor device in which silicon has been adopted as a material.

For example, in a metal oxide semiconductor field effect transistor (MOSFET) and an insulated gate bipolar transistor (IGBT) among semiconductor devices in which silicon carbide is employed as a material, whether a current which is to flow between two electrodes is allowed or not allowed to flow can be controlled by controlling whether or not an inversion layer is formed in a channel region with a prescribed threshold voltage being defined as a boundary.

For example, Mitsuo Okamoto et al., "Reduction of Instability in Vth of 4H-SiC Carbon Face MOSFETs," the 59th Spring Meeting, Proceedings, The Japan Society of Applied Physics, Spring 2012, pp. 15-309 (NPD 1) has pointed out that a silicon carbide MOSFET suffers from fluctuation in threshold voltage due to gate bias stress. This document discloses a method of annealing a silicon carbide substrate having a gate oxide film formed in a hydrogen atmosphere in order to lessen fluctuation in threshold voltage.

CITATION LIST

Non Patent Document

NPD 1: Mitsuo Okamoto et al., "Reduction of Instability in Vth of 4H-SiC Carbon Face MOSFETs," the 59th Spring Meeting, Proceedings, The Japan Society of Applied Physics, Spring 2012, pp. 15-309

SUMMARY OF INVENTION

Technical Problem

In a case of annealing in a hydrogen atmosphere, however, even though fluctuation in threshold voltage can temporarily be lessened, an effect of lessening of fluctuation in threshold voltage may be lost, for example, when a substrate is exposed to a high temperature in a subsequent step of forming an ohmic electrode. In other words, though fluctuation in threshold voltage is lessened at the stage of formation of a gate electrode on the substrate, fluctuation in threshold voltage may not be lessened at the stage of a final device.

The present invention was made to solve the problem above, and an object thereof is to provide a silicon carbide semiconductor device in which fluctuation in threshold voltage can be lessened and a method for manufacturing the same.

Solution to Problem

A silicon carbide semiconductor device according to the present invention includes a silicon carbide substrate, a gate insulating film, and a gate electrode. The silicon carbide substrate has a first main surface and a second main surface opposite to the first main surface. The gate insulating film is provided as being in contact with the first main surface of the silicon carbide substrate. The gate electrode is provided on the gate insulating film such that the gate insulating film lies between the gate electrode and the silicon carbide substrate. In a first stress test in which a gate voltage of −5 V is applied to the gate electrode for 100 hours at a temperature of 175° C., an absolute value of a difference between a first threshold voltage and a second threshold voltage is not more than 0.5 V, with a threshold voltage before the first stress test being defined as the first threshold voltage and a threshold voltage after the first stress test being defined as the second threshold voltage.

A method for manufacturing a silicon carbide semiconductor device according to the present invention includes the steps below. An intermediate substrate including one main surface and the other main surface opposite to one main surface is prepared. A sodium blocking member is arranged as being in contact with one main surface of the intermediate substrate. The intermediate substrate is annealed while the sodium blocking member is in contact with one main surface. The sodium blocking member is removed from one main surface after the step of annealing the intermediate substrate. The intermediate substrate includes a silicon carbide substrate having a first main surface facing one main surface and a second main surface opposite to the first main surface, which forms the other main surface of the intermediate substrate, a gate insulating film partially in contact with the first main surface of the silicon carbide substrate, and a source electrode in contact with the first main surface exposed through the gate insulating film. A diffusion length of sodium into the sodium blocking member is not greater than a diffusion length of sodium into silicon carbide.

A method for manufacturing a silicon carbide semiconductor device according to the present invention includes the steps below. An intermediate substrate including one main surface and the other main surface opposite to one main surface is prepared. A first sodium sucking member is arranged as being in contact with one main surface of the intermediate substrate. The intermediate substrate is annealed while the first sodium sucking member is in contact with one main surface. The first sodium sucking member is removed from one main surface after the step of annealing the intermediate substrate. The intermediate substrate includes a silicon carbide substrate having a first main surface facing one main surface and a second main surface opposite to the first main surface, which forms the other main surface of the intermediate substrate, a gate insulating film partially in contact with the first main surface of the silicon carbide substrate, and a source electrode in contact with the first main surface exposed through the gate insulating film. A diffusion length of sodium into the first sodium sucking member is greater than a diffusion length of sodium into silicon carbide.

Advantageous Effects of Invention

According to the present invention, a silicon carbide semiconductor device in which fluctuation in threshold voltage can be lessened and a method for manufacturing the same can be provided.

BRIEF DESCRIPTION OF DRAWINGS

FIG. 27 is a diagram illustrating amounts of fluctuation in threshold voltage of the MOSFETs associated with samples 1, 4, 5, and 6 under a condition of a temperature of 150° C. and a gate voltage of −10 V.

DESCRIPTION OF EMBODIMENTS

Figure 1:
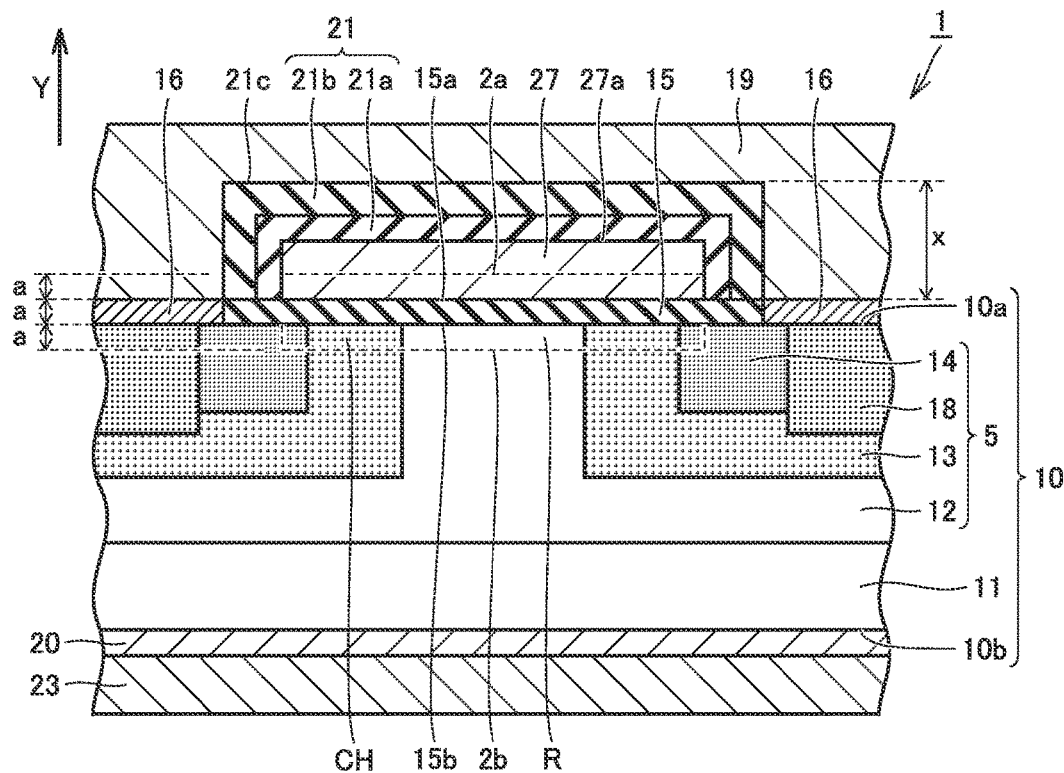
FIG. 1 is a schematic cross-sectional view for schematically illustrating a structure of a silicon carbide semiconductor device according to one embodiment of the present invention.

Description of Embodiment of Invention of Present Application

An embodiment of the present invention will be described hereinafter with reference to the drawings. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is expressed by a number with a bar "−" thereabove, however, a negative sign herein precedes a number. In expressing an angle, a system in which a total azimuth angle is defined as 360 degrees is employed.

The inventors have conducted dedicated studies about approaches for suppressing fluctuation in threshold voltage due to gate bias stress, and obtained the findings as follows and found the present invention.

Initially, before and after a step of forming a source electrode, a metal impurity such as sodium (Na), sulfur (S), potassium (K), iron (Fe), copper (Cu), magnesium (Mg), and calcium (Ca) which are present in an atmosphere adheres to a surface of an interlayer insulating film provided on a silicon carbide substrate. A metal impurity such as sodium enters a gate electrode through the surface of the interlayer insulating film due to heat treatment in the step of forming a source electrode and a step subsequent to the step of forming a source electrode and diffuses into a portion around the gate insulating film. It is expected that such a metal impurity supplies charges during an operation of a MOSFET, and consequently a threshold voltage lowers and a current tends to flow.

As a result of further studies, it has been found that particularly sodium among metal impurities affects fluctuation in threshold voltage. As a result of further detailed studies, it has been found that fluctuation in threshold voltage due to gate bias stress can effectively be lessened by suppressing the total number of sodium around the gate insulating film to a number not greater than a certain number. Specifically, with an interface between the gate insulating film and the gate electrode being defined as a first interface and a region facing the first interface in an interface between the gate insulating film and the silicon carbide substrate being defined as a second interface, a value calculated by dividing a total number of sodium contained in an interface region lying between a first virtual surface distant from the first interface toward the gate electrode by a thickness of the gate insulating film along a direction of normal to the first interface and a second virtual surface distant from the second interface toward the silicon carbide substrate by the thickness of the gate insulating film along a direction of normal to the second interface by an area of the first interface is controlled to $5 \times 10^{10}$ atoms/cm$^2$ or less.

As a result of dedicated studies, the inventors have found that diffusion of sodium ions into crystals of silicon carbide is slower than diffusion of sodium into crystals of silicon which has conventionally widely been used. When an amount of an impurity represented by externally introduced sodium is constant, diffusion of sodium into crystals of silicon carbide is slower than diffusion of sodium into crystals of silicon, which means that sodium is more likely to be accumulated at surfaces of crystals of silicon carbide than at surfaces of crystals of silicon.

The inventors have examined a state of diffusion of sodium into a silicon substrate and a silicon carbide substrate. Specifically, four trays made of graphite in which a certain amount of sodium was attached as NaCl were initially prepared. A silicon substrate was placed in each of two trays, and a silicon carbide substrate was placed in each of two remaining trays. Each tray was constituted of an upper lid and a lower lid which formed a closed space, and the substrate was confined in the closed space. Each tray was subjected to heat treatment for 5 minutes at a temperature of 1000° C. Thereafter, the silicon substrate and the silicon carbide substrate were taken out of the trays and a concentration of sodium in the surface of each substrate was measured with inductively coupled plasma mass spectrometry (ICP-MS).

TABLE 1

| | Material | Na Concentration ($10^9$ atoms/cm$^2$) |
|---|---|---|
| Sample 1 | Si | 170 |
| Sample 2 | Si | 140 |
| Sample 3 | SiC | 1700 |
| Sample 4 | SiC | 1500 |

A concentration of sodium in the surface of each substrate will be described with reference to Table 1. Sample 1 and sample 2 represent silicon substrates and sample 3 and sample 4 represent silicon carbide substrates. As shown in Table 1, concentrations of sodium in the surfaces of the silicon substrates subjected to heat treatment were $170 \times 10^9$ atoms/cm$^2$ and $140 \times 10^9$ atoms/cm$^2$, respectively. Concentrations of sodium in the surfaces of the silicon carbide substrates subjected to heat treatment were $1700 \times 10^9$ atoms/cm$^2$ and $1500 \times 10^9$ atoms/cm$^2$, respectively. Namely, the concentration of sodium in the surface of the silicon carbide substrate exhibited a value higher by one order than the concentration of sodium in the surface of the silicon substrate. Similar relation was confirmed also in a case that a temperature and a time period for heat treatment were varied.

It has been found from the results above that a silicon carbide substrate is slower in diffusion of sodium into a substrate than a silicon substrate, and hence more sodium is accumulated at the surface of the substrate. Therefore, in using a silicon carbide substrate, control for lessening introduction of an impurity and control of a concentration in the substrate more stricter than in use of a silicon substrate is required.

(1) A silicon carbide semiconductor device according to the embodiment includes a silicon carbide substrate 10, a gate insulating film 15, and a gate electrode 27. Silicon carbide substrate 10 has a first main surface 10a and a second main surface 10b opposite to first main surface 10a. Gate insulating film 15 is provided as being in contact with first main surface 10a of silicon carbide substrate 10. Gate electrode 27 is provided on gate insulating film 15 such that gate insulating film 15 lies between gate electrode 27 and silicon carbide substrate 10. In a first stress test in which a gate voltage of −5 V is applied to gate electrode 27 for 100 hours at a temperature of 175° C., an absolute value of a difference between a first threshold voltage and a second threshold voltage is not more than 0.5 V, with a threshold voltage before the first stress test being defined as the first threshold voltage and a threshold voltage after the first stress test being defined as the second threshold voltage. Fluctuation in threshold voltage of the silicon carbide semiconductor device can thus effectively be lessened.

(2) In the silicon carbide semiconductor device according to (1), preferably, in a second stress test in which a gate voltage of −10 V is applied to gate electrode 27 for 100 hours at a temperature of 150° C., an absolute value of a difference between a third threshold voltage and a fourth threshold voltage is not more than 0.1 V, with a threshold voltage before the second stress test being defined as the third threshold voltage and a threshold voltage after the second stress test being defined as the fourth threshold voltage. Fluctuation in threshold voltage of the silicon carbide semiconductor device can thus more effectively be lessened.

(3) In the silicon carbide semiconductor device according to (1) or (2), preferably, with an interface between gate insulating film 15 and gate electrode 27 being defined as a first interface 15a and a region facing first interface 15a in an interface between gate insulating film 15 and silicon carbide substrate 10 being defined as a second interface 15b, a value calculated by dividing a total number of sodium contained in an interface region R lying between a first virtual surface 2a distant from first interface 15a toward gate electrode 27 by a thickness of gate insulating film 15 along a direction of normal to first interface 15a and a second virtual surface 2b distant from second interface 15b toward silicon carbide substrate 10 by the thickness of gate insulating film 15 along a direction of normal to second interface 15b by an area of first interface 15a is not more than $5 \times 10^{10}$ atoms/cm$^2$. Fluctuation in threshold voltage of the silicon carbide semiconductor device can thus more effectively be lessened.

(4) In the silicon carbide semiconductor device according to (3), preferably, a maximal value of a concentration of sodium in a region within 10 nm from a third main surface 27a of gate electrode 27 opposite to second interface 15b is greater than a maximal value of a concentration of sodium in interface region R, and the maximal value of the concentration of sodium in interface region R is not more than $1 \times 10^{16}$ atoms/cm$^3$. Thus, even when a silicon carbide semiconductor device is manufactured in an environment high in concentration of sodium, a silicon carbide semiconductor device small in amount of fluctuation in threshold voltage can be obtained.

(5) The silicon carbide semiconductor device according to any of (1) to (4) preferably further includes an interlayer insulating film 21 covering third main surface 27a of gate electrode 27 opposite to second interface 15b and provided as being in contact with gate insulating film 15 and a source electrode 16 in contact with first main surface 10a of silicon carbide substrate 10. A temperature and a time period for heat treatment carried out on gate electrode 27 and interlayer insulating film 21 after a step of annealing the source electrode are controlled such that a condition of $N_0 \times L_T / x < 1.52 \times 10^{20}$ is satisfied, where $L_T$ (nm) represents a diffusion length of sodium, x (nm) represents a distance from a surface 21c of interlayer insulating film 21 opposite to third main surface 27a in a direction along a direction of normal Y to first interface 15a to first interface 15a, and $N_0$ (cm$^{-3}$) represents a concentration of sodium in surface 21c of interlayer insulating film 21. Fluctuation in threshold voltage of the silicon carbide semiconductor device can thus more effectively be lessened.

(6) In the silicon carbide semiconductor device according to any of (3) to (5), preferably, a maximal value of a concentration of sodium in a region within 10 nm from second main surface 10b of silicon carbide substrate 10 is greater than the maximal value of the concentration of sodium in interface region R. Thus, fluctuation in threshold voltage of a silicon carbide semiconductor device can be lessened by keeping the concentration of sodium in interface region R low even in an environment high in concentration of sodium.

(7) A method for manufacturing a silicon carbide semiconductor device according to the embodiment includes steps below. An intermediate substrate 100 including one main surface 21c and the other main surface 10b opposite to one main surface 21c is prepared. A sodium blocking member 7a is arranged as being in contact with one main surface 21c of intermediate substrate 100. Intermediate substrate 100 is annealed while sodium blocking member 7a is in contact with one main surface 21c. Sodium blocking member 7a is removed from one main surface 21c after the step of annealing intermediate substrate 100. Intermediate substrate 100 includes silicon carbide substrate 10 having first main surface 10a facing one main surface 21c and second main surface 10b opposite to first main surface 10a, which forms the other main surface 10b of intermediate substrate 100, gate insulating film 15 partially in contact with first main surface 10a of silicon carbide substrate 10, and source electrode 16 in contact with first main surface 10a exposed through gate insulating film 15. A diffusion length of sodium into sodium blocking member 7a is not greater than a diffusion length of sodium into silicon carbide. Sodium blocking member 7a can effectively block introduction of sodium from the outside into one main surface 21c of intermediate substrate 100. Therefore, since a concentration of sodium in interface region R can be kept low, fluctuation in threshold voltage of a silicon carbide semiconductor device can be lessened.

(8) In the method for manufacturing a silicon carbide semiconductor device according to (7), preferably, sodium blocking member 7a includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium from the outside into one main surface 21c of intermediate substrate 100 can more effectively be blocked.

(9) The method for manufacturing a silicon carbide semiconductor device according to (7) or (8) preferably further includes the step of arranging an intermediate substrate holding portion 4 facing the other main surface 10b of intermediate substrate 100. A diffusion length of sodium into intermediate substrate holding portion 4 is not greater than the diffusion length of sodium into silicon carbide. Intermediate substrate holding portion 4 can effectively block introduction of sodium into the other main surface 10b of intermediate substrate 100.

(10) In the method for manufacturing a silicon carbide semiconductor device according to (9), preferably, intermediate substrate holding portion 4 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into the other main surface 10b of intermediate substrate 100 can more effectively be blocked.

(11) The method for manufacturing a silicon carbide semiconductor device according to (9) or (10) preferably further includes the step of arranging a lid portion 6 being in contact with intermediate substrate holding portion 4 and covering sodium blocking member 7a. In the step of annealing intermediate substrate 100, intermediate substrate 100 is annealed while intermediate substrate 100 is arranged in a space surrounded by lid portion 6 and intermediate substrate holding portion 4. A diffusion length of sodium into lid portion 6 is not greater than the diffusion length of sodium into silicon carbide. Lid portion 6 can effectively block introduction of sodium into one main surface 21c of intermediate substrate 100.

(12) In the method for manufacturing a silicon carbide semiconductor device according to (11), preferably, lid portion 6 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into one main surface 21c of intermediate substrate 100 can more effectively be blocked.

(13) A method for manufacturing a silicon carbide semiconductor device according to the embodiment includes steps below. Intermediate substrate 100 including one main surface 21c and the other main surface 10b opposite to one main surface 21c is prepared. A first sodium sucking member 7b is arranged as being in contact with one main surface 21c of intermediate substrate 100. Intermediate substrate 100 is annealed while first sodium sucking member 7b is in contact with one main surface 21c. First sodium sucking member 7b is removed from one main surface 21c after the step of annealing intermediate substrate 100. Intermediate substrate 100 includes silicon carbide substrate 10 having first main surface 10a facing one main surface 21c and second main surface 10b opposite to first main surface 10a, which forms the other main surface 10b of intermediate substrate 100, gate insulating film 15 partially in contact with first main surface 10a of silicon carbide substrate 10, and source electrode 16 in contact with first main surface 10a exposed through gate insulating film 15. A diffusion length of sodium into first sodium sucking member 7b is greater than a diffusion length of sodium into silicon carbide. Therefore, even when one main surface 21c of intermediate substrate 100 is contaminated with sodium, first sodium sucking member 7b sucks sodium on one main surface 21c of intermediate substrate 100 so that a concentration of sodium in one main surface 21c of intermediate substrate 100 can effectively be lowered. Therefore, since a concentration of sodium in interface region R can be kept low, fluctuation in threshold voltage of a silicon carbide semiconductor device can be lessened.

(14) In the method for manufacturing a silicon carbide semiconductor device according to (13), preferably, first sodium sucking member 7b includes at least one selected from the group consisting of a silicon layer, a silicon dioxide layer, a layer in which a silicon layer is coated with a silicon dioxide layer, and a layer in which a silicon dioxide layer is coated with a silicon layer. Thus, sodium on one main surface 21c of intermediate substrate 100 can more effectively be sucked.

(15) In the method for manufacturing a silicon carbide semiconductor device according to (13) or (14), preferably, in a cross-sectional view, first sodium sucking member 7b has a thickness not smaller than 300 μm. Sodium on one main surface 21c of intermediate substrate 100 can thus more effectively be sucked.

(16) The method for manufacturing a silicon carbide semiconductor device according to any of (13) to (15) preferably further includes the steps of arranging a second sodium sucking member 7c as being in contact with the other main surface 10b of intermediate substrate 100 before the step of annealing intermediate substrate 100 and removing second sodium sucking member 7c from the other main surface 10b after the step of annealing intermediate substrate 100. In the step of annealing intermediate substrate 100, intermediate substrate 100 is annealed while first sodium sucking member 7b is in contact with one main surface 21c of intermediate substrate 100 and second sodium sucking member 7c is in contact with the other main surface 10b of intermediate substrate 100. A diffusion length of sodium into second sodium sucking member 7c is greater than the diffusion length of sodium into silicon carbide. Second sodium sucking member 7c can effectively suck sodium on the other main surface 10b of intermediate substrate 100.

(17) The method for manufacturing a silicon carbide semiconductor device according to any of (13) to (16) preferably further includes the step of arranging intermediate substrate holding portion 4 facing the other main surface 10b of intermediate substrate 100. A diffusion length of sodium into intermediate substrate holding portion 4 is not greater than the diffusion length of sodium into silicon carbide. Intermediate substrate holding portion 4 can effectively block introduction of sodium into the other main surface 10b of intermediate substrate 100.

(18) In the method for manufacturing a silicon carbide semiconductor device according to (17), preferably, intermediate substrate holding portion 4 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into the other main surface 10b of intermediate substrate 100 can more effectively be blocked.

(19) The method for manufacturing a silicon carbide semiconductor device according to (17) or (18) preferably further includes the step of arranging lid portion 6 being in contact with intermediate substrate holding portion 4 and covering first sodium sucking member 7b. In the step of annealing intermediate substrate 100, intermediate substrate 100 is annealed while intermediate substrate 100 is arranged in a space surrounded by lid portion 6 and intermediate substrate holding portion 4. A diffusion length of sodium into lid portion 6 is not greater than the diffusion length of sodium into silicon carbide. Lid portion 6 can effectively block introduction of sodium into one main surface 21c of intermediate substrate 100.

(20) In the method for manufacturing a silicon carbide semiconductor device according to (19), preferably, lid portion 6 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into one main surface 21c of intermediate substrate 100 can more effectively be blocked.

(21) In the method for manufacturing a silicon carbide semiconductor device according to any of (13) to (20), preferably, first sodium sucking member 7b includes a fourth main surface 7b2 in contact with one main surface 21c and a fifth main surface 7b1 opposite to fourth main surface 7b2. The method further includes the steps of arranging sodium blocking member 7a as being in contact with fifth main surface 7b1 of first sodium sucking member 7b and removing sodium blocking member 7a from intermediate substrate 100 after the step of annealing intermediate substrate 100. In the step of annealing intermediate substrate 100, intermediate substrate 100 is annealed while sodium blocking member 7a is in contact with fifth main surface 7b1 of first sodium sucking member 7b and fourth main surface 7b2 of first sodium sucking member 7b is in contact with one main surface 21c of intermediate substrate 100. A diffusion length of sodium into sodium blocking member 7a is not greater than the diffusion length of sodium into silicon carbide. Sodium blocking member 7a can more effectively block introduction of sodium into one main surface 21c of intermediate substrate 100.

(22) In the method for manufacturing a silicon carbide semiconductor device according to (21), preferably, sodium blocking member 7a includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into one main surface 21c of intermediate substrate 100 can more effectively be blocked.

Details of Embodiment of Invention of Present Application

A construction of a MOSFET 1 representing a silicon carbide semiconductor device according to one embodiment of the present invention will initially be described.

Referring to FIG. 1, MOSFET 1 according to the present embodiment mainly has silicon carbide substrate 10, gate electrode 27, gate insulating film 15, interlayer insulating film 21, source electrode 16, a surface protecting electrode 19, a drain electrode 20, and a backside protecting electrode 23. Silicon carbide substrate 10 has first main surface 10a and second main surface 10b opposite to first main surface 10a and mainly includes a silicon carbide single-crystal substrate 11 and a silicon carbide epitaxial layer 5 provided on silicon carbide single-crystal substrate 11.

Silicon carbide single-crystal substrate 11 is composed of single crystals of hexagonal silicon carbide having, for example, a polytype of 4H. First main surface 10a of silicon carbide substrate 10 has a maximal diameter greater than 100 mm, preferably not smaller than 150 mm, and more preferably not smaller than 200 mm. First main surface 10a of silicon carbide substrate 10 is, for example, a {0001} plane or a surface angled off by not greater than 8° from the {0001} plane. Specifically, first main surface 10a is, for example, a (0001) plane or a surface angled off by not greater than 8° from the (0001) plane, and second main surface 10b is a (000-1) plane or a surface angled off by approximately not greater than 8° from the (000-1) plane. Silicon carbide substrate 10 has a thickness, for example, not greater than 700 μm and preferably not greater than 600 μm. Silicon carbide substrate 10 has a thickness preferably not smaller than 250 μm and smaller than 600 μm, more preferably not smaller than 300 μm and smaller than 600 μm, further preferably not smaller than 250 μm and not greater than 500 μm, and further preferably not smaller than 350 μm and not greater than 500 μm.

Silicon carbide epitaxial layer 5 has a drift region 12, a body region 13, a source region 14, and a contact region 18. Drift region 12 is an n-type (a first conductivity type) region containing such an impurity as nitrogen. An impurity concentration in drift region 12 is, for example, around $5.0 \times 10^{15}$ cm$^{-3}$. Body region 13 is a region having a p-type (a second conductivity type). An impurity contained in body region 13 is, for example, aluminum (Al) or boron (B). A concentration of an impurity contained in body region 13 is, for example, around $1 \times 10^{17}$ cm$^{-3}$.

Source region 14 is an n-type region containing such an impurity as phosphorus. Source region 14 is formed in body region 13 as being surrounded by body region 13. Source region 14 is higher in impurity concentration than drift region 12. An impurity concentration in source region 14 is, for example, $1 \times 10^{20}$ cm$^{-3}$. Source region 14 is spaced apart from drift region 12 by body region 13.

Contact region 18 is a p-type region. Contact region 18 is provided as being surrounded by source region 14 and formed as being in contact with body region 13. Contact region 18 contains such an impurity as Al or B at a concentration higher than a concentration of an impurity contained in body region 13. A concentration of an impurity such as Al or B in contact region 18 is, for example, $1 \times 10^{20}$ cm$^{-3}$.

Gate insulating film 15 is formed as being in contact with first main surface 10a of silicon carbide substrate 10 so as to extend from an upper surface of one source region 14 to an upper surface of the other source region 14. Gate insulating film 15 is in contact with source region 14, body region 13, and drift region 12 at first main surface 10a of silicon carbide substrate 10. Gate insulating film 15 is composed, for example, of silicon dioxide. Gate insulating film 15 has a thickness a preferably approximately not smaller than 10 nm and not greater than 100 nm, more preferably approximately not smaller than 40 nm and not greater than 60 nm, and for example, of 45 nm.

Gate electrode 27 is arranged as being in contact with gate insulating film 15 so as to extend from above one source region 14 to above the other source region 14. Gate electrode 27 is provided on gate insulating film 15 such that gate insulating film 15 lies between gate electrode 27 and silicon carbide substrate 10. Gate electrode 27 is formed on source region 14, body region 13, and drift region 12, with gate insulating film 15 being interposed. Gate electrode 27 is formed of a conductor such as polysilicon doped with an impurity or Al.

Source electrode 16 extends from above each of a pair of source regions 14 to above contact region 18 in a direction away from gate insulating film 15 and is arranged as being in contact with first main surface 10a of silicon carbide substrate 10. Source electrode 16 is in contact with first main surface 10a of silicon carbide substrate 10. Source electrode 16 is in contact with source region 14 and contact region 18 at first main surface 10a of silicon carbide substrate 10. Source electrode 16 contains, for example, TiAlSi and is in ohmic contact with silicon carbide substrate 10.

Interlayer insulating film 21 is provided as being in contact with gate electrode 27 and gate insulating film 15. Interlayer insulating film 21 electrically isolates gate electrode 27 and source electrode 16 from each other. Interlayer insulating film 21 includes a first insulating film 21a provided to cover gate electrode 27 and a second insulating film 21b provided to cover first insulating film 21a. Second insulating film 21b may contain phosphorus as an impurity more than first insulating film 21a. Surface protecting electrode 19 is formed as being in contact with source electrode 16 and contains a conductor such as Al. Surface protecting electrode 19 is electrically connected to source region 14 through source electrode 16.

Drain electrode 20 is provided as being in contact with second main surface 10b of silicon carbide substrate 10. Drain electrode 20 may be composed of another material such as nickel silicide (NiSi) which can establish ohmic contact with silicon carbide single-crystal substrate 11. Drain electrode 20 is thus electrically connected to silicon carbide single-crystal substrate 11. Backside protecting electrode 23 is formed as being in contact with a main surface of drain electrode 20 opposite to silicon carbide single-crystal substrate 11. Backside protecting electrode 23 has a stack structure constituted, for example, of a Ti layer, a Pt layer, and an Au layer.

A total number of sodium in an interface region will now be described with reference to FIGS. 1 and 2.

An interface between gate insulating film 15 and gate electrode 27 is defined as first interface 15a and a region facing first interface 15a in an interface between gate insulating film 15 and silicon carbide substrate 10 is defined as second interface 15b. A region lying between first virtual surface 2a distant from first interface 15a toward gate electrode 27 by thickness a of gate insulating film 15 along direction of normal Y to first interface 15a and second virtual surface 2b distant from second interface 15b toward silicon carbide substrate 10 by thickness a of gate insulating film 15 along direction of normal Y to second interface 15b is defined as interface region R. A value calculated by dividing the total number of sodium contained in interface region R by an area of first interface 15a is preferably not more than $5 \times 10^{10}$ atoms/cm$^2$, more preferably not more than $3 \times 10^{10}$ atoms/cm$^2$, and further preferably not more than $1 \times 10^{10}$ atoms/cm$^2$.

Figure 2:
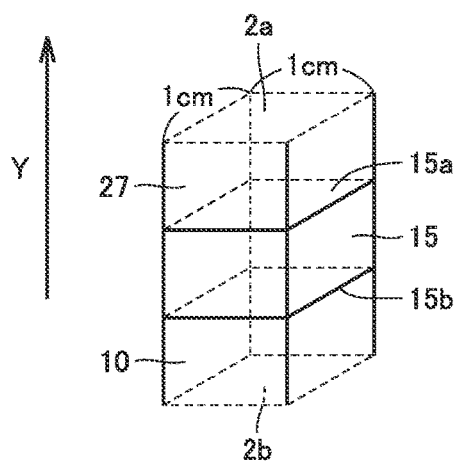
FIG. 2 is a diagram for illustrating definition of a total number of sodium.

Referring to FIG. 2, a value calculated by dividing the total number of sodium contained in interface region R by an area of first interface 15a represents the number of sodium atoms in interface region R per unit area (1 cm$^2$) of first interface 15a. In other words, a value calculated by dividing the total number of sodium contained in interface region R by an area of first interface 15a represents the total number of sodium atoms contained in a parallelepiped shown in FIG. 2. The total number of sodium can be counted with a secondary ion-microprobe mass spectrometer (SIMS).

Preferably, a maximal value of a concentration of sodium in a region within 10 nm from third main surface 27a of gate electrode 27 opposite to second interface 15b is greater than a maximal value of a concentration of sodium in interface region R, and the maximal value of the concentration of sodium in interface region R is not more than $1 \times 10^{16}$ atoms/cm$^3$. A maximal value of a concentration of sodium in a region within 10 nm from third main surface 27a of gate electrode 27 may be not less than $1 \times 10^{18}$ atoms/cm$^3$. Preferably, a maximal value of a concentration of sodium in a region within 10 nm from second main surface 10b of silicon carbide substrate 10 is greater than the maximal value of the concentration of sodium in interface region R. The region within 10 nm from the main surface means a region lying between surfaces distant by ±10 nm from the main surface along direction of normal Y to first interface 15a.

Figure 3:
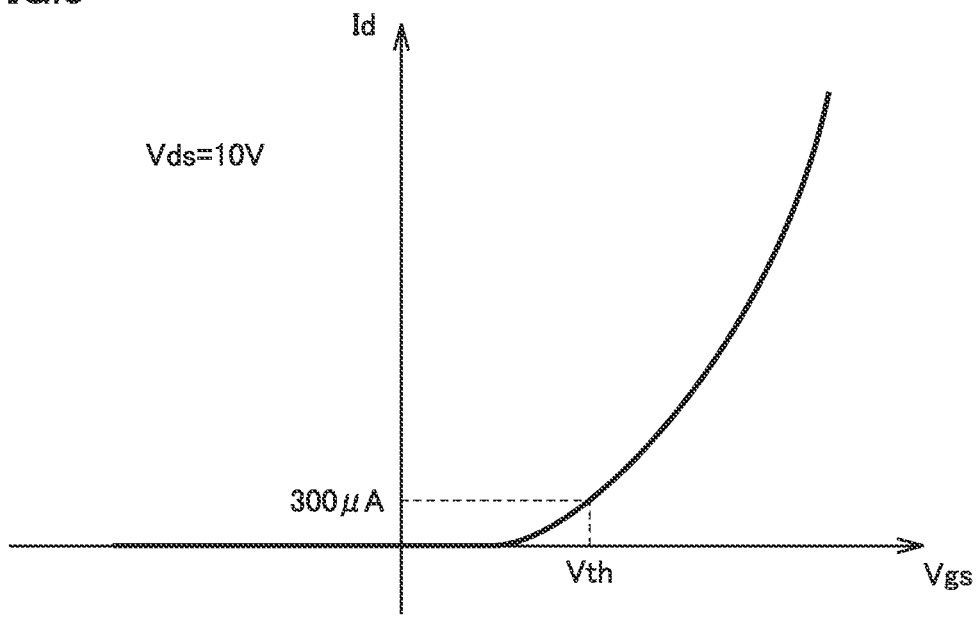
FIG. 3 is a diagram for illustrating definition of a threshold voltage of a silicon carbide semiconductor device.

Definition of a threshold voltage ($V_{th}$) of a silicon carbide semiconductor device will be described with reference to FIG. 3. Initially, a drain current (that is, a source-drain current $I_d$) is measured with a gate voltage (that is, a gate-source voltage $V_{gs}$) being varied. When the gate voltage is lower than the threshold voltage, a pn junction between body region 13 and drift region 12 located directly under gate insulating film 15 is reverse-biased and in a non-conducting state (an off state). Therefore, substantially no drain current flows between source electrode 16 (a first electrode) and drain electrode 20 (a second electrode). When a voltage equal to or higher than the threshold voltage is applied to gate electrode 27, an inversion layer is formed in a channel region CH around a portion of contact of body region 13 with gate insulating film 15. Consequently, source region 14 and drift region 12 are electrically connected to each other so that a drain current starts to flow between source electrode 16 and drain electrode 20. Namely, the threshold voltage refers to a gate voltage at which a drain current starts to flow. More specifically, the threshold voltage refers to a gate voltage at which a drain current attains to 300 μA when a voltage ($V_{ds}$) between the source and the drain is at 10 V.

Figure 4:
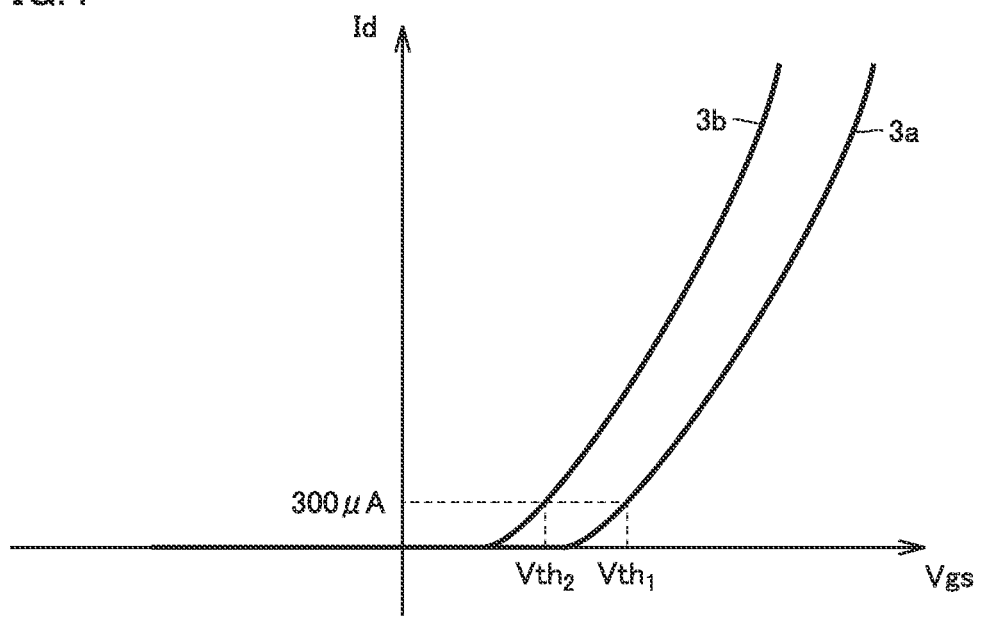
FIG. 4 is a diagram for illustrating a first threshold voltage and a second threshold voltage of the silicon carbide semiconductor device according to one embodiment of the present invention.

Fluctuation in threshold voltage of a silicon carbide semiconductor device will be described with reference to FIG. 4. Initially, a drain current is measured with a gate voltage applied to the silicon carbide semiconductor device being varied, and relation 3a between the gate voltage and the drain current is plotted. A gate voltage at which a drain current attains to 300 μA when a voltage between the source and the drain is at 10 V is defined as a first threshold voltage ($V_{th1}$). Then, a stress test in which a negative voltage is applied to gate electrode 27 of the silicon carbide semiconductor device for a certain period of time is conducted. Thereafter, a drain current is measured with a gate voltage applied to the silicon carbide semiconductor device being varied and relation 3b between the gate voltage and the drain current is plotted. A gate voltage at which a drain current attains to 300 μA when a voltage between the source and the drain is at 10 V is defined as a second threshold voltage ($V_{th2}$). As shown in FIG. 4, the threshold voltage may fluctuate after the stress test. In particular, when the threshold voltage fluctuates toward a negative side, a switching operation which should be a normally off operation may be an on operation.

In MOSFET 1 according to the present embodiment, in a first stress test in which a gate voltage of −5 V is applied to gate electrode 27 for 100 hours at a temperature of 175° C., an absolute value of a difference between the first threshold voltage and the second threshold voltage (in other words, an amount of fluctuation in threshold voltage) is not more than 0.5 V, preferably not more than 0.3 V, and more preferably not more than 0.1 V, with a threshold voltage before the first stress test being defined as the first threshold voltage and a threshold voltage after the first stress test being defined as the second threshold voltage. The second threshold voltage may be higher or lower than the first threshold voltage.

Preferably, in the first stress test in which a gate voltage of −5 V is applied to gate electrode 27 for 300 hours at a temperature of 175° C., an absolute value of a difference between the first threshold voltage and the second threshold voltage is not more than 0.5 V, preferably not more than 0.3 V, and more preferably not more than 0.1 V, with a threshold voltage before the first stress test being defined as the first threshold voltage and a threshold voltage after the first stress test being defined as the second threshold voltage. The second threshold voltage may be higher or lower than the first threshold voltage.

Preferably, in the first stress test in which a negative bias not lower than 5 V defined as an absolute value is applied to gate electrode 27 for 300 hours at a temperature of 175° C., an absolute value of a difference between the first threshold voltage and the second threshold voltage is not more than 0.5 V, preferably not more than 0.3 V, and more preferably not more than 0.1 V, with a threshold voltage before the first stress test being defined as the first threshold voltage and a threshold voltage after the first stress test being defined as the second threshold voltage. The second threshold voltage may be higher or lower than the first threshold voltage.

Preferably, in a second stress test in which a gate voltage of −10 V is applied to gate electrode 27 for 100 hours at a temperature of 150° C., an absolute value of a difference between a third threshold voltage and a fourth threshold voltage (in other words, an amount of fluctuation in threshold voltage) is not more than 0.1 V, with a threshold voltage before the second stress test being defined as the third threshold voltage and a threshold voltage after the second stress test being defined as the fourth threshold voltage. The fourth threshold voltage may be higher or lower than the third threshold voltage.

Preferably, in the second stress test in which a gate voltage of −10 V is applied to gate electrode 27 for 300 hours at a temperature of 150° C., an absolute value of a difference between the third threshold voltage and the fourth threshold voltage is not more than 0.1 V, with a threshold voltage before the second stress test being defined as the third threshold voltage and a threshold voltage after the second stress test being defined as the fourth threshold voltage. The fourth threshold voltage may be higher or lower than the third threshold voltage.

A method for manufacturing MOSFET 1 representing the silicon carbide semiconductor device according to the present embodiment will now be described.

Figure 5:
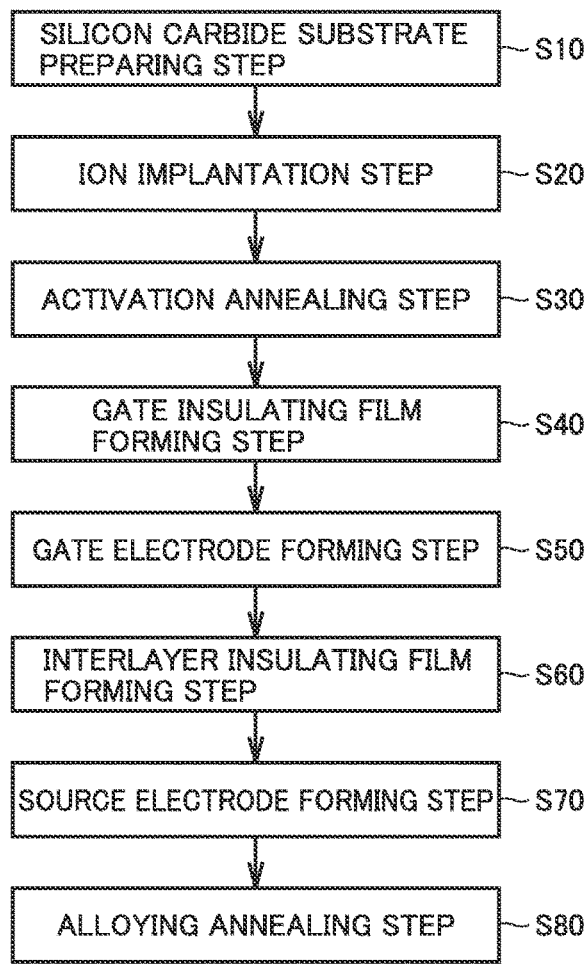
FIG. 5 is a flowchart for schematically illustrating a method for manufacturing a silicon carbide semiconductor device according to one embodiment of the present invention.
Figure 6:
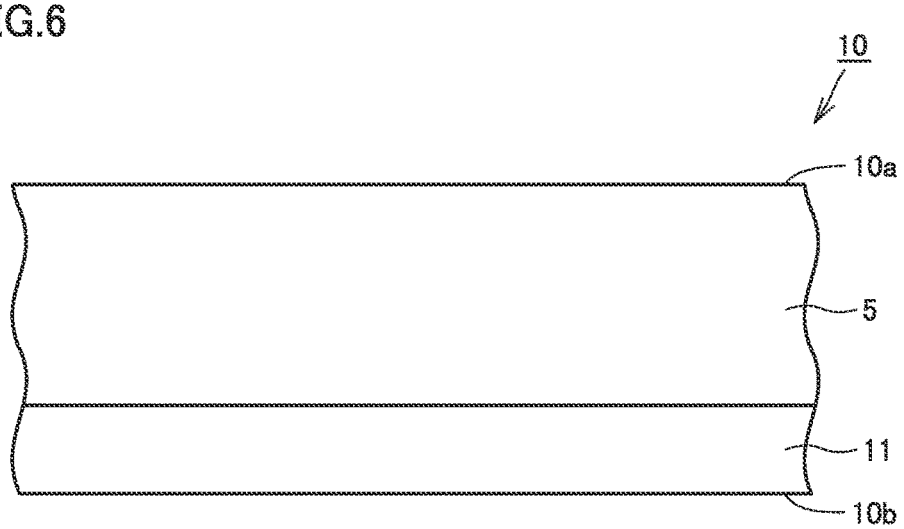
FIG. 6 is a schematic cross-sectional view for schematically illustrating a first step in the method for manufacturing a silicon carbide semiconductor device according to one embodiment of the present invention.

Initially, a silicon carbide substrate preparing step (S10: FIG. 5) is performed. For example, silicon carbide single-crystal substrate 11 is prepared by slicing an ingot composed of single crystals of hexagonal silicon carbide formed with a sublimation method and having polytype 4H. Then, silicon carbide epitaxial layer 5 is formed on silicon carbide single-crystal substrate 11, for example, with chemical vapor deposition (CVD). Specifically, a carrier gas containing hydrogen ($H_2$) and a source gas containing monosilane ($SiH_4$), propane ($C_3H_8$), and nitrogen ($N_2$) are supplied over silicon carbide single-crystal substrate 11, and silicon carbide single-crystal substrate 11 is heated to a temperature, for example, approximately not lower than 1500° C. and not higher than 1700° C. Thus, as shown in FIG. 6, silicon carbide epitaxial layer 5 is formed on silicon carbide single-crystal substrate 11. As above, silicon carbide substrate 10 having first main surface 10a and second main surface 10b opposite to first main surface 10a is prepared. Silicon carbide substrate 10 includes silicon carbide single-crystal substrate 11 forming second main surface 10b and silicon carbide epitaxial layer 5 provided on silicon carbide single-crystal substrate 11 and forming first main surface 10a.

Figure 7:
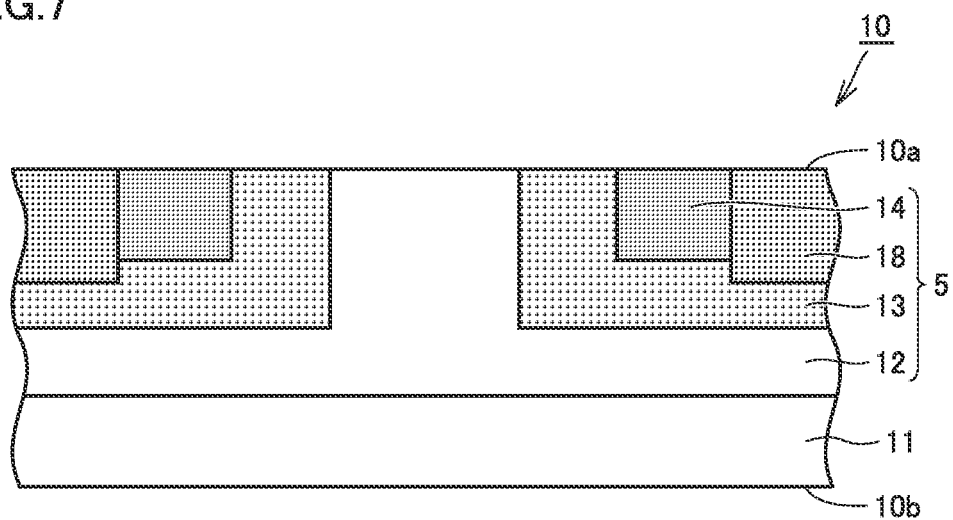
FIG. 7 is a schematic cross-sectional view for schematically illustrating a second step in the method for manufacturing a silicon carbide semiconductor device according to one embodiment of the present invention.

Then, an ion implantation step (S20: FIG. 5) is performed. Specifically, referring to FIG. 7, ions are implanted into first main surface 10a of silicon carbide substrate 10. For example, aluminum (Al) ions are implanted into first main surface 10a of silicon carbide substrate 10, so that body region 13 having the p conductivity type is formed in silicon carbide epitaxial layer 5. Then, for example, ions of phosphorus (P) are implanted into body region 13 to a depth smaller than an implantation depth of Al ions, so that source region 14 having then conductivity type is formed. For example, Al ions are further implanted into source region 14, so that contact region 18 surrounded by source region 14, having a depth as large as source region 14, and having the p conductivity type is formed. A region in silicon carbide epitaxial layer 5 where none of body region 13, source region 14, and contact region 18 is formed is defined as drift region 12. As above, body region 13, source region 14, and contact region 18 are formed on a side of first main surface 10a of silicon carbide substrate 10.

Then, an activation annealing step (S30: FIG. 5) is performed. Specifically, silicon carbide substrate 10 is heated to a temperature, for example, not lower than 1600° C. and not higher than 2000° C. for approximately 30 minutes. Thus, impurities in body region 13, source region 14, and contact region 18 formed in the ion implantation step are activated and desired carriers are generated.

Figure 8:
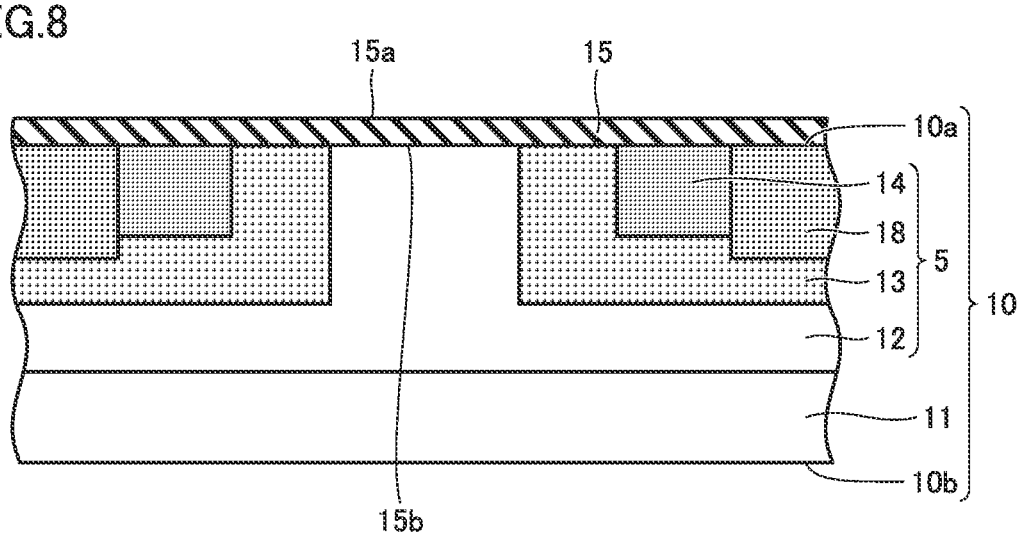
FIG. 8 is a schematic cross-sectional view for schematically illustrating a third step in the method for manufacturing a silicon carbide semiconductor device according to one embodiment of the present invention.

Then, a gate insulating film forming step (S40: FIG. 5) is performed. Referring to FIG. 8, for example, gate insulating film 15 composed of silicon dioxide is formed to cover first main surface 10a of silicon carbide substrate 10, by heating silicon carbide substrate 10 for approximately 1 hour in an atmosphere containing oxygen at a temperature around 1350° C. Specifically, gate insulating film 15 is formed as being in contact with drift region 12, body region 13, source region 14, and contact region 18 at first main surface 10a, so as to extend from one contact region 18 to the other contact region 18.

Then, a nitrogen annealing step is performed. Specifically, silicon carbide substrate 10 having gate insulating film 15 formed is held, for example, for approximately 1 hour at a temperature not lower than 1300° C. and not higher than 1500° C. in an atmospheric gas containing nitrogen such as nitrogen monoxide, nitrous oxide, nitrogen dioxide, and ammonia. Through this heat treatment, nitrogen atoms are captured in traps present around second interface 15b between gate insulating film 15 and drift region 12. Formation of an interface state around second interface 15b is thus suppressed.

Then, an Ar annealing step is performed. Specifically, silicon carbide substrate 10 having gate insulating film 15 formed is held in an argon gas for approximately 1 hour at a temperature, for example, not lower than 1100° C. and not higher than 1500° C. Preferably, silicon carbide substrate 10 having gate insulating film 15 formed is held at a temperature not lower than 1300° C. and not higher than 1500° C. Through this heat treatment, excessive carbon around second interface 15b between silicon carbide substrate 10 and gate insulating film 15 can be reduced. Consequently, hole traps around second interface 15b can be reduced.

Then, a gate electrode forming step (S50: FIG. 5) is performed. Gate electrode 27 being in contact with gate insulating film 15 and composed of polysilicon containing an impurity is formed, for example, with low pressure chemical vapor deposition (LPCVD). Gate electrode 27 is formed to face drift region 12, source region 14, and body region 13, with gate insulating film 15 being interposed.

Then, an interlayer insulating film forming step (S60: FIG. 5) is performed. Interlayer insulating film 21 composed, for example, of silicon dioxide is formed to cover gate insulating film 15 and gate electrode 27. Specifically, a tetraethylorthosilicate (TEOS) gas is supplied over silicon carbide substrate 10 for approximately 6 hours at a temperature, for example, approximately not lower than 650° C. and not higher than 750° C. Thereafter, silicon carbide substrate 10 is heated for approximately 30 minutes, for example, at a temperature approximately not lower than 800° C. and not higher than 900° C. Then, phosphorus silicon glass (PSG) treatment is performed for approximately 20 minutes at a temperature, for example, approximately not lower than 900° C. and not higher than 1100° C. Thus, interlayer insulating film 21 including first insulating film 21a provided to cover gate electrode 27 and second insulating film 21b provided to cover first insulating film 21a is formed. Second insulating film 21b contains phosphorus as an impurity more than first insulating film 21a.

Figure 9:
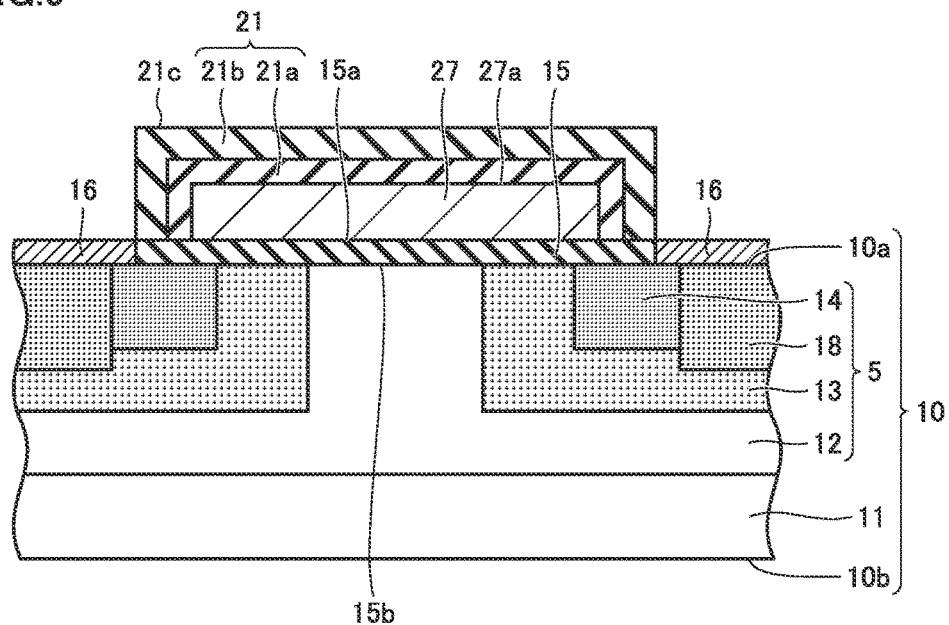
FIG. 9 is a schematic cross-sectional view for schematically illustrating a fourth step in the method for manufacturing a silicon carbide semiconductor device according to one embodiment of the present invention.

Then, a source electrode forming step (S70: FIG. 5) is performed. Referring to FIG. 9, interlayer insulating film 21 and gate insulating film 15 are removed in a region where source electrode 16 is to be formed, and a region where source region 14 and contact region 18 are exposed through interlayer insulating film 21 and gate insulating film 15 is formed. Then, source electrode 16 containing, for example, NiSi, TiSi, TiAl, or TiAlSi (titanium aluminum silicon) is formed in that region, for example, through sputtering. Source electrode 16 is formed as being in contact with first main surface 10a of silicon carbide substrate 10. Thus, silicon carbide substrate 10 provided with source electrode 16, gate electrode 27, interlayer insulating film 21, and gate insulating film 15 (hereinafter referred to as an intermediate structure 100 or an intermediate substrate 100) is formed. Intermediate substrate 100 includes one main surface 21c and the other main surface 10b opposite to one main surface 21c. Intermediate substrate 100 includes silicon carbide substrate 10 having first main surface 10a facing one main surface 21c and second main surface 10b opposite to first main surface 10a, which forms the other main surface 10b of intermediate substrate 100, gate insulating film 15 partially in contact with first main surface 10a of silicon carbide substrate 10, and source electrode 16 in contact with first main surface 10a exposed through gate insulating film 15 (see FIG. 11).

Then, an alloying annealing step (S80: FIG. 5) is performed. The alloying annealing step (S80: FIG. 5) includes the steps of mounting a cover member on the intermediate substrate and annealing the intermediate substrate on which the cover member is mounted. Initially, the step of mounting the cover member on the intermediate substrate is performed. Initially, referring to FIG. 10, intermediate structure 100 is arranged in a tray 4 composed of carbon. A cover member 2 is arranged to cover intermediate structure 100. A lid portion 6 composed of carbon is arranged above cover member 2, so that intermediate structure 100 provided with cover member 2 may be surrounded by tray 4 and lid portion 6. Second main surface 10b of silicon carbide substrate 10 of intermediate structure 100 is arranged as being in contact with the tray. Cover member 2 is composed, for example, of silicon carbide or silicon and preferably of silicon carbide. Cover member 2 has a thickness, for example, approximately not smaller than 300 μm and not greater than 1 mm.

Figure 11:
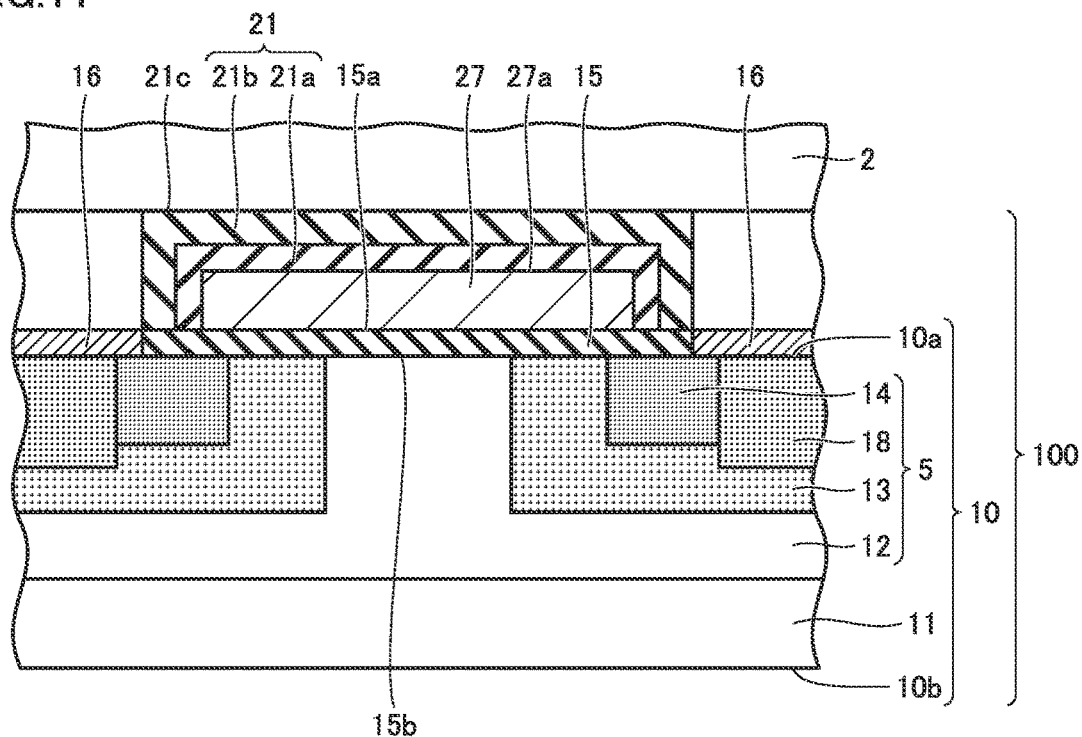
FIG. 11 is an enlarged schematic cross-sectional view for schematically illustrating the fifth step in the method for manufacturing a silicon carbide semiconductor device according to one embodiment of the present invention.
Figure 12:
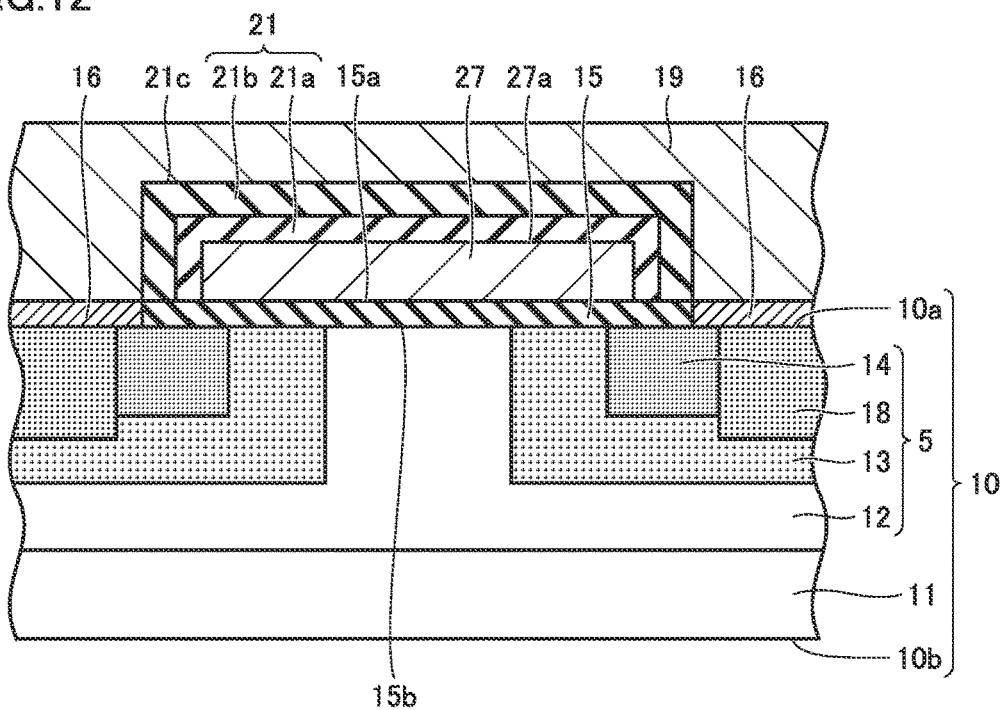
FIG. 12 is a schematic cross-sectional view for schematically illustrating a sixth step in the method for manufacturing a silicon carbide semiconductor device according to one embodiment of the present invention.

Referring to FIG. 11, more specifically, cover member 2 may be arranged on a side of first main surface 10a of silicon carbide substrate 10 such that cover member 2 is in contact with surface 21c of interlayer insulating film 21 and cover member 2 is distant from source electrode 16. Preferably, cover member 2 is provided to cover the entire first main surface 10a of silicon carbide substrate 10. Then, the step of annealing the intermediate substrate on which the cover member is mounted is performed. Specifically, silicon carbide substrate 10 provided with source electrode 16 and cover member 2 are heated for approximately 5 minutes at a temperature, for example, not lower than 900° C. and not higher than 1100° C. while cover member 2 is arranged on the side of first main surface 10a of silicon carbide substrate 10 such that cover member 2 is in contact with interlayer insulating film 21 and cover member 2 is distant from source electrode 16. Thus, at least a part of source electrode 16 is silicided and source electrode 16 in ohmic contact with source region 14 is formed.

When cover member 2 is arranged to cover intermediate structure 100 in the alloying annealing step (S80: FIG. 5), adhesion of a metal impurity such as sodium present in an annealing furnace to surface 21c of interlayer insulating film 21 arranged on the side of first main surface 10a of silicon carbide substrate 10 can be suppressed. Through heat treatment performed in the alloying annealing step and heat treatment performed after the alloying annealing step, a metal impurity such as sodium adhering to surface 21c of interlayer insulating film 21 may diffuse into interface region R (see FIG. 1) in the vicinity of gate insulating film 15. Then, by performing alloying annealing on intermediate structure 100 and cover member 2 after cover member 2 is arranged to cover intermediate structure 100, diffusion of a metal impurity such as sodium into interface region R can be suppressed. After the alloying annealing step ends, cover member 2 is removed from the side of first main surface 10a of silicon carbide substrate 10.

A first modification of the alloying annealing step (S80: FIG. 5) will now be described.

Figure 15:
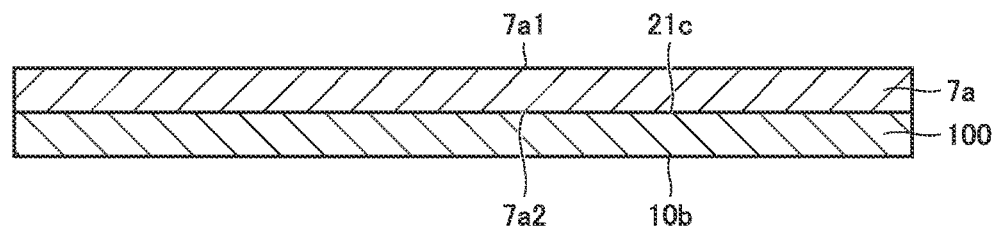
FIG. 15 is a schematic cross-sectional view for schematically illustrating a first example of a first modification of the fifth step in the method for manufacturing a silicon carbide semiconductor device according to one embodiment of the present invention.

Referring to FIG. 15, in the step of mounting the cover member on the intermediate substrate, a sodium blocking member 7a is arranged as being in contact with one main surface 21c of intermediate substrate 100. Sodium blocking member 7a has a sixth main surface 7a2 in contact with one main surface 21c of intermediate substrate 100 and a seventh main surface 7a1 opposite to sixth main surface 7a2. Sixth main surface 7a2 of sodium blocking member 7a is arranged to cover the entire one main surface 21c of intermediate substrate 100. Preferably, in a cross-sectional view (a field of view along a direction in parallel to the other main surface 10b of intermediate substrate 100), sodium blocking member 7a is not smaller in width than intermediate substrate 100.

A diffusion length of sodium into sodium blocking member 7a is not greater than a diffusion length of sodium into silicon carbide. A material for forming sodium blocking member 7a is exemplified by silicon carbide or carbon. Preferably, sodium blocking member 7a includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

Then, the step of annealing the intermediate substrate on which the cover member is mounted is performed. Specifically, intermediate substrate 100 is annealed while sodium blocking member 7a is in contact with one main surface 21c of intermediate substrate 100. Intermediate substrate 100 is annealed for approximately 5 minutes at a temperature, for example, not lower than 900° C. and not higher than 1100° C. After intermediate substrate 100 is annealed, sodium blocking member 7a is removed from one main surface 21c of intermediate substrate 100. Sodium blocking member 7a can effectively block introduction of sodium from the outside into one main surface 21c of intermediate substrate 100. External contamination with sodium may be contamination from a tray and contamination from facilities. Regarding a source of contamination of the facilities, a heater portion at a high temperature may be one of sources of generation of sodium.

Figure 16:
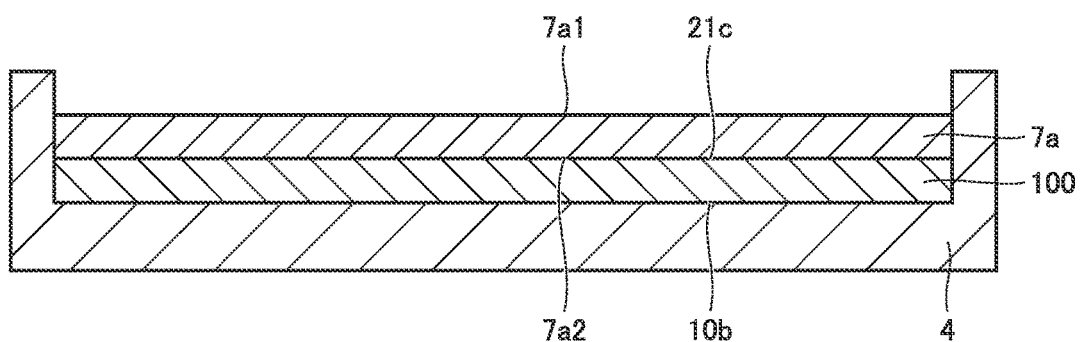
FIG. 16 is a schematic cross-sectional view for schematically illustrating a second example of the first modification of the fifth step in the method for manufacturing a silicon carbide semiconductor device according to one embodiment of the present invention.

Referring to FIG. 16, in the step of mounting the cover member on the intermediate substrate, intermediate substrate holding portion 4 may be arranged at a position facing the other main surface 10b of intermediate substrate 100. Intermediate substrate holding portion 4 is implemented, for example, by a tray which can hold intermediate substrate 100. Intermediate substrate holding portion 4 is in contact with the other main surface 10b, for example, so as to entirely cover the other main surface 10b of intermediate substrate 100. A wall portion of intermediate substrate holding portion 4 extends in a direction of normal to the other main surface 10b of intermediate substrate 100 so as to face a side surface of each of intermediate substrate 100 and sodium blocking member 7a. Preferably, in a cross-sectional view, intermediate substrate holding portion 4 is not smaller in width than intermediate substrate 100. Intermediate substrate holding portion 4 may be in such a shape that one opening of a cylinder is closed, in a disc shape, or in other shapes.

A diffusion length of sodium into intermediate substrate holding portion 4 is not greater than the diffusion length of sodium into silicon carbide. For example, carbon is employed as a material for forming intermediate substrate holding portion 4. Preferably, intermediate substrate holding portion 4 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. In a case that intermediate substrate holding portion 4 is composed of carbon (graphite), sodium forms an Na—C compound in graphite and hence a diffusion length of sodium into graphite may be short.

Then, in the step of annealing intermediate substrate 100, intermediate substrate 100 is annealed while one main surface 21c of intermediate substrate 100 is covered with sodium blocking member 7a and the other main surface 10b and side surfaces of intermediate substrate 100 are covered with intermediate substrate holding portion 4. A temperature and a time period for annealing intermediate substrate 100 are the same as the conditions described above. After intermediate substrate 100 is annealed, sodium blocking member 7a is removed from one main surface 21c of intermediate substrate 100 and intermediate substrate 100 is detached from intermediate substrate holding portion 4.

Figure 17:
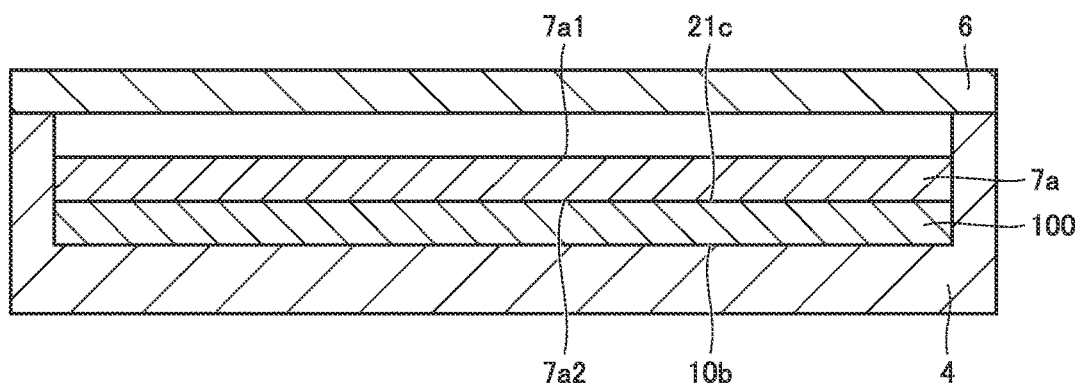
FIG. 17 is a schematic cross-sectional view for schematically illustrating a third example of the first modification of the fifth step in the method for manufacturing a silicon carbide semiconductor device according to one embodiment of the present invention.

Referring to FIG. 17, in the step of mounting the cover member on the intermediate substrate, lid portion 6 may be arranged to be in contact with intermediate substrate holding portion 4 and to cover sodium blocking member 7a. Lid portion 6 is constructed such that a closed space surrounded by lid portion 6 and intermediate substrate holding portion 4 is formed as a result of combination with intermediate substrate holding portion 4. Sodium blocking member 7a and intermediate substrate 100 are arranged in the closed space. Seventh main surface 7a1 of sodium blocking member 7a may be distant from lid portion 6 or may be in contact therewith. Lid portion 6 may be in a disc shape, in such a shape that one opening of a cylinder is closed, in such a shape that a central portion of a disc protrudes, or in other shapes.

Then, in the step of annealing intermediate substrate 100, intermediate substrate 100 is annealed while sodium blocking member 7a and intermediate substrate 100 are arranged in the closed space surrounded by lid portion 6 and intermediate substrate holding portion 4. A temperature and a time period for annealing intermediate substrate 100 are the same as the conditions described above. A diffusion length of sodium into lid portion 6 is not greater than the diffusion length of sodium into silicon carbide. For example, carbon is employed as a material for forming lid portion 6. Preferably, lid portion 6 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

A second modification of the alloying annealing step (S80: FIG. 5) will now be described.

Figure 18:
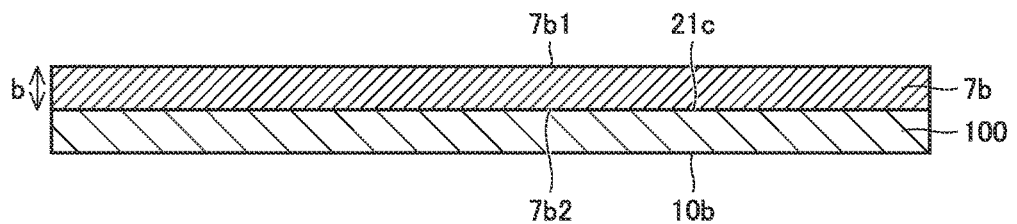
FIG. 18 is a schematic cross-sectional view for schematically illustrating a first example of a second modification of the fifth step in the method for manufacturing a silicon carbide semiconductor device according to one embodiment of the present invention.

Referring to FIG. 18, in the step of mounting the cover member on the intermediate substrate, a first sodium sucking member 7b is arranged as being in contact with one main surface 21c of intermediate substrate 100. A diffusion length of sodium into first sodium sucking member 7b is greater than the diffusion length of sodium into silicon carbide. For example, silicon is employed as a material for forming first sodium sucking member 7b. Preferably, first sodium sucking member 7b includes at least one selected from the group consisting of a silicon layer, a silicon dioxide layer, a layer in which a silicon layer is coated with a silicon dioxide layer, and a layer in which a silicon dioxide layer is coated with a silicon layer. Silicon may be single-crystal silicon, polycrystalline silicon, amorphous silicon, or combination thereof. Preferably, in a cross-sectional view, first sodium sucking member 7b is not smaller in width than intermediate substrate 100.

Then, the step of annealing the intermediate substrate on which the cover member is mounted is performed. Specifically, intermediate substrate 100 is annealed while first sodium sucking member 7b is in contact with one main surface 21c. A temperature and a time period for annealing intermediate substrate 100 are the same as the conditions described above. After intermediate substrate 100 is annealed, first sodium sucking member 7b is removed from one main surface 21c of intermediate substrate 100. As first sodium sucking member 7b sucks sodium on one main surface 21c of intermediate substrate 100, a concentration of sodium on one main surface 21c of intermediate substrate 100 can effectively be lowered. In other words, capturing by gettering of an impurity such as sodium is promoted at an interface between intermediate substrate 100 and first sodium sucking member 7b, so that diffusion of sodium into intermediate substrate 100 can be suppressed. For example, in a case of annealing of a substrate for 5 minutes at a temperature of 1000° C., a diffusion distance of sodium into silicon is approximately 500 nm and a diffusion distance of sodium into silicon dioxide is approximately 400 nm. In order for first sodium sucking member 7b to effectively suck sodium, first sodium sucking member 7b has a thickness b preferably not smaller than 300 μm in a cross-sectional view. Thickness b of first sodium sucking member 7b may be greater than a distance from first main surface 10a of silicon carbide substrate 10 to one main surface 21c of intermediate substrate 100 along the direction of normal to first main surface 10a of silicon carbide substrate 10.

Figure 19:
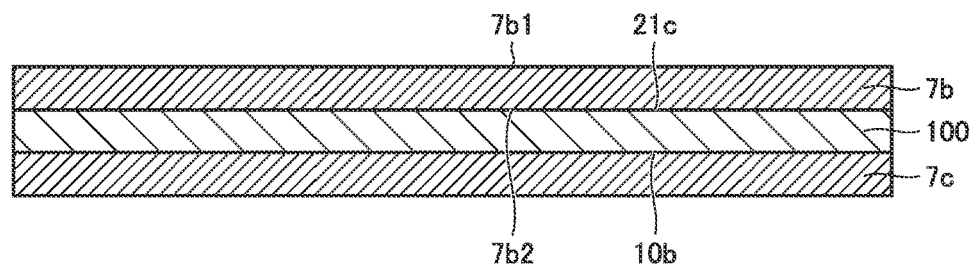
FIG. 19 is a schematic cross-sectional view for schematically illustrating a second example of the second modification of the fifth step in the method for manufacturing a silicon carbide semiconductor device according to one embodiment of the present invention.

Referring to FIG. 19, in the step of mounting the cover member on the intermediate substrate, second sodium sucking member 7c may be arranged as being in contact with the other main surface 10b of intermediate substrate 100. Namely, first sodium sucking member 7b is arranged as being in contact with one main surface 21c of intermediate substrate 100 and second sodium sucking member 7c is arranged as being in contact with the other main surface 10b of intermediate substrate 100. A diffusion length of sodium into second sodium sucking member 7c is greater than the diffusion length of sodium into silicon carbide. For example, silicon is employed as a material for forming second sodium sucking member 7c. A material forming second sodium sucking member 7c is the same as the material for forming first sodium sucking member 7b. Preferably, second sodium sucking member 7c is not smaller in width than intermediate substrate 100 in a cross-sectional view.

Then, the step of annealing the intermediate substrate on which the cover member is mounted is performed. Specifically, intermediate substrate 100 is annealed while first sodium sucking member 7b is in contact with one main surface 21c of intermediate substrate 100 and second sodium sucking member 7c is in contact with the other main surface 10b of intermediate substrate 100. A temperature and a time period for annealing intermediate substrate 100 are the same as the conditions described above. After intermediate substrate 100 is annealed, first sodium sucking member 7b is removed from one main surface 21c of intermediate substrate 100 and second sodium sucking member 7c is removed from the other main surface 10b.

Figure 20:
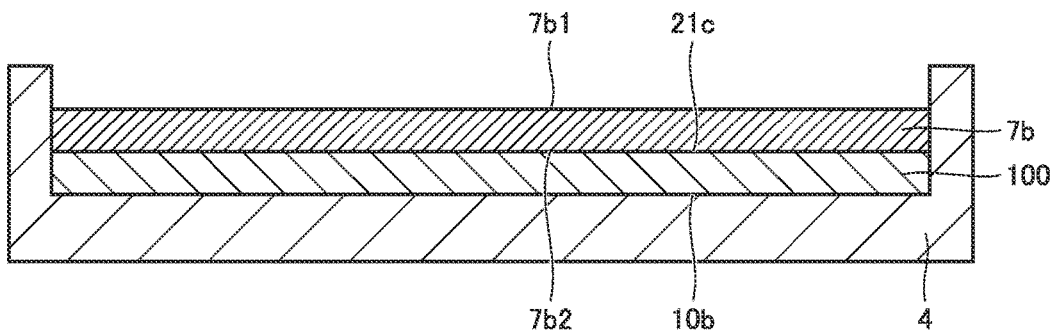
FIG. 20 is a schematic cross-sectional view for schematically illustrating a third example of the second modification of the fifth step in the method for manufacturing a silicon carbide semiconductor device according to one embodiment of the present invention.

Referring to FIG. 20, in the step of mounting the cover member on the intermediate substrate, intermediate substrate holding portion 4 may be arranged at a position facing the other main surface 10b of intermediate substrate 100. Intermediate substrate holding portion 4 is implemented, for example, by a tray which can hold intermediate substrate 100. Intermediate substrate holding portion 4 is in contact with the other main surface 10b, for example, so as to entirely cover the other main surface 10b of intermediate substrate 100. A wall portion of intermediate substrate holding portion 4 extends in a direction of normal to the other main surface 10b of intermediate substrate 100 so as to face a side surface of each of intermediate substrate 100 and sodium blocking member 7a. Preferably, in a cross-sectional view, intermediate substrate holding portion 4 is not smaller in width than intermediate substrate 100. Intermediate substrate holding portion 4 may be in such a shape that one opening of a cylinder is closed, in a disc shape, or in other shapes.

A diffusion length of sodium into intermediate substrate holding portion 4 is not greater than the diffusion length of sodium into silicon carbide. For example, carbon is employed as a material for forming intermediate substrate holding portion 4. Preferably, intermediate substrate holding portion 4 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

Then, in the step of annealing intermediate substrate 100, intermediate substrate 100 is annealed while one main surface 21c of intermediate substrate 100 is covered with first sodium sucking member 7b and the other main surface 10b and side surfaces of intermediate substrate 100 are covered with intermediate substrate holding portion 4. A temperature and a time period for annealing intermediate substrate 100 are the same as the conditions described above. After intermediate substrate 100 is annealed, first sodium sucking member 7b is removed from one main surface 21c of intermediate substrate 100 and intermediate substrate 100 is detached from intermediate substrate holding portion 4.

Figure 21:
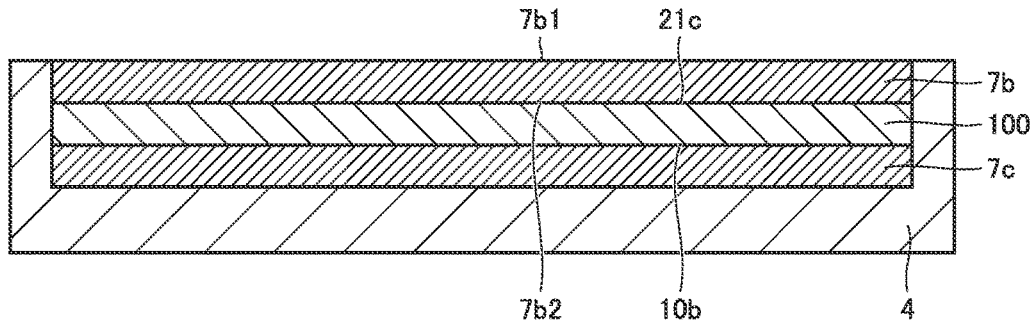
FIG. 21 is a schematic cross-sectional view for schematically illustrating a fourth example of the second modification of the fifth step in the method for manufacturing a silicon carbide semiconductor device according to one embodiment of the present invention.

Referring to FIG. 21, in the step of mounting the cover member on the intermediate substrate, intermediate substrate 100 in which first sodium sucking member 7b is arranged as being in contact with one main surface 21c and second sodium sucking member 7c is arranged as being in contact with the other main surface 10b is arranged to completely bury a recess portion formed in intermediate substrate holding portion 4. Intermediate substrate 100 is arranged in the recess portion formed in intermediate substrate holding portion 4 such that a surface of second sodium sucking member 7c opposite to a surface in contact with the other main surface 10b of intermediate substrate 100 is in contact with intermediate substrate holding portion 4 and the side surface of each of intermediate substrate 100, first sodium sucking member 7b, and second sodium sucking member 7c is covered with intermediate substrate holding portion 4.

Then, in the step of annealing intermediate substrate 100, intermediate substrate 100 is annealed while one main surface 21c of intermediate substrate 100 is covered with first sodium sucking member 7b, the other main surface 10b of intermediate substrate 100 faces intermediate substrate holding portion 4, and the surface of second sodium sucking member 7c opposite to the surface in contact with the other main surface 10b of intermediate substrate 100 is covered with intermediate substrate holding portion 4. A temperature and a time period for annealing intermediate substrate 100 are the same as the conditions described above. After intermediate substrate 100 is annealed, first sodium sucking member 7b is removed from one main surface 21c of intermediate substrate 100, second sodium sucking member 7c is removed from the other main surface 10b of intermediate substrate 100, and intermediate substrate 100 is detached from intermediate substrate holding portion 4.

Figure 22:
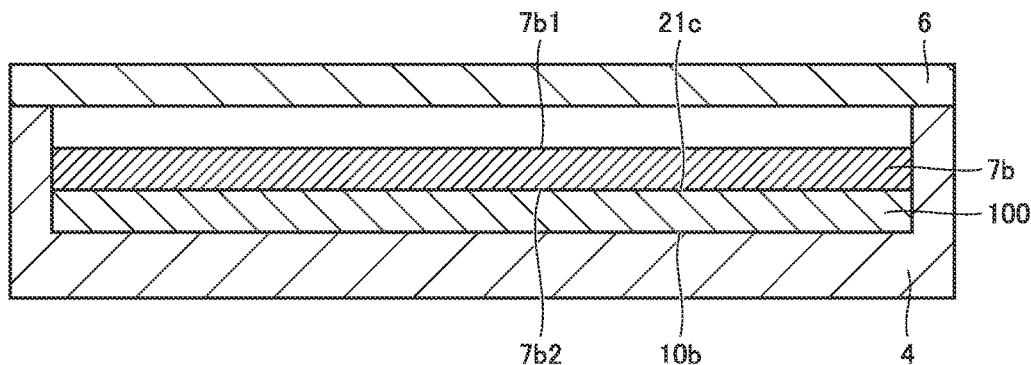
FIG. 22 is a schematic cross-sectional view for schematically illustrating a fifth example of the second modification of the fifth step in the method for manufacturing a silicon carbide semiconductor device according to one embodiment of the present invention.

Referring to FIG. 22, in the step of mounting the cover member on the intermediate substrate, lid portion 6 may be arranged to be in contact with intermediate substrate holding portion 4 and to cover first sodium sucking member 7b. Lid portion 6 is constructed such that a closed space surrounded by lid portion 6 and intermediate substrate holding portion 4 is formed as a result of combination with intermediate substrate holding portion 4. Intermediate substrate 100 in which first sodium sucking member 7b is arranged on one main surface 21c is arranged in the closed space. First sodium sucking member 7b includes a fourth main surface 7b2 in contact with one main surface 21c of intermediate substrate 100 and a fifth main surface 7b1 opposite to fourth main surface 7b2. Fifth main surface 7b1 of first sodium sucking member 7b may be distant from lid portion 6 or may be in contact therewith. Lid portion 6 has a shape the same as the shape of lid portion 6 described above.

Figure 23:
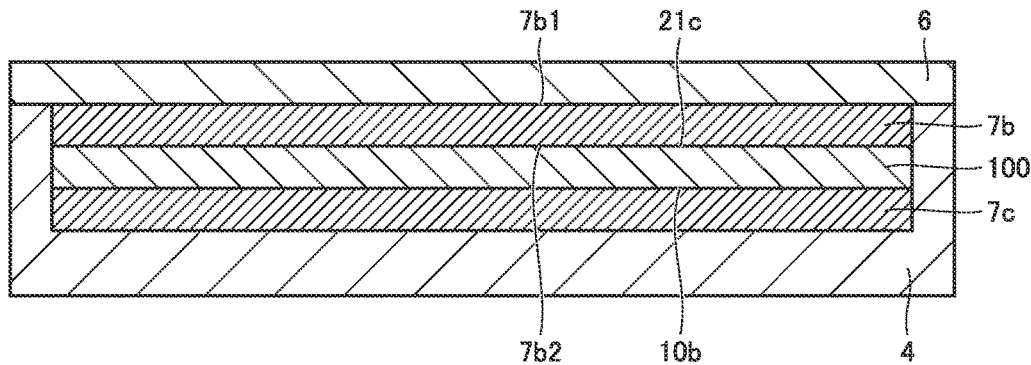
FIG. 23 is a schematic cross-sectional view for schematically illustrating a sixth example of the second modification of the fifth step in the method for manufacturing a silicon carbide semiconductor device according to one embodiment of the present invention.

Referring to FIG. 23, in the step of mounting the cover member on the intermediate substrate, intermediate substrate 100 in which first sodium sucking member 7b is arranged as being in contact with one main surface 21c and second sodium sucking member 7c is arranged as being in contact with the other main surface 10b is arranged in the closed space surrounded by lid portion 6 and intermediate substrate holding portion 4. Fifth main surface 7b1 of first sodium sucking member 7b is in contact with lid portion 6.

Then, in the step of annealing intermediate substrate 100, intermediate substrate 100 is annealed while intermediate substrate 100 is arranged in the closed space surrounded by lid portion 6 and intermediate substrate holding portion 4. A temperature and a time period for annealing intermediate substrate 100 are the same as the conditions described above. A diffusion length of sodium into lid portion 6 is not greater than the diffusion length of sodium into silicon carbide. For example, carbon is employed as a material for forming lid portion 6. Preferably, lid portion 6 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

Figure 24:
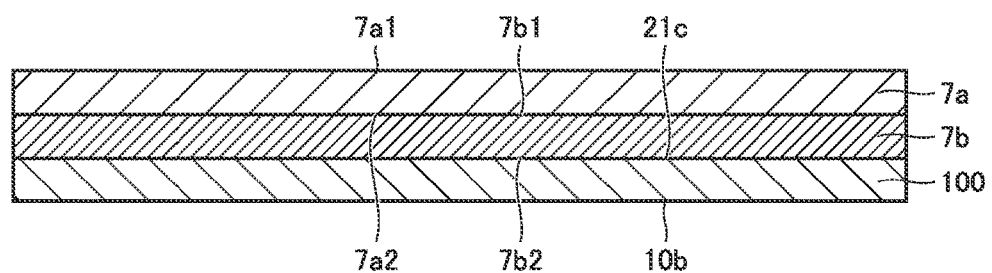
FIG. 24 is a schematic cross-sectional view for schematically illustrating a seventh example of the second modification of the fifth step in the method for manufacturing a silicon carbide semiconductor device according to one embodiment of the present invention.
Figure 25:
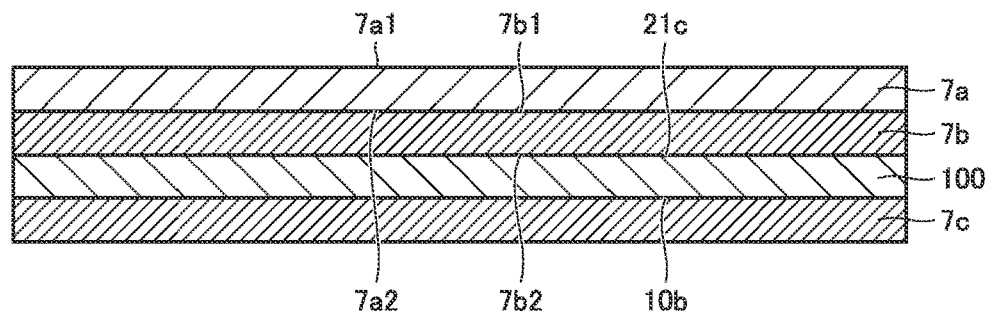
FIG. 25 is a schematic cross-sectional view for schematically illustrating an eighth example of the second modification of the fifth step in the method for manufacturing a silicon carbide semiconductor device according to one embodiment of the present invention.

Referring to FIG. 24, in the step of mounting the cover member on the intermediate substrate, sodium blocking member 7a may be arranged as being in contact with fifth main surface 7b1 of first sodium sucking member 7b. Thus, intermediate substrate 100 in which first sodium sucking member 7b is arranged as being in contact with one main surface 21c of intermediate substrate 100 and sodium blocking member 7a is arranged as being in contact with fifth main surface 7b1 of first sodium sucking member 7b is prepared. A diffusion length of sodium into sodium blocking member 7a is not greater than the diffusion length of sodium into silicon carbide. For example, silicon carbide or carbon is employed as a material for forming sodium blocking member 7a. Preferably, sodium blocking member 7a includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Sodium blocking member 7a is not smaller in width than intermediate substrate 100 in a cross-sectional view. Referring to FIG. 25, in the step of mounting the cover member on the intermediate substrate, second sodium sucking member 7c may be arranged on the other main surface 10b of intermediate substrate 100. A material for forming second sodium sucking member 7c is as described above.

Alternatively, intermediate substrate 100 in which first sodium sucking member 7b is arranged as being in contact with one main surface 21c of intermediate substrate 100, sodium blocking member 7a is arranged as being in contact with fifth main surface 7b1 of first sodium sucking member 7b, and second sodium sucking member 7c is arranged on the other main surface 10b may be held on intermediate substrate holding portion 4, and in addition, lid portion 6 may be arranged as being in contact with intermediate substrate holding portion 4.

Then, in the step of annealing intermediate substrate 100, intermediate substrate 100 is annealed while sodium blocking member 7a is in contact with fifth main surface 7b1 of first sodium sucking member 7b and fourth main surface 7b2 of first sodium sucking member 7b is in contact with one main surface 21c of intermediate substrate 100. Furthermore, intermediate substrate 100 may be annealed while second sodium sucking member 7c is arranged as being in contact with the other main surface 10b of intermediate substrate 100. After intermediate substrate 100 is annealed, sodium blocking member 7a and first sodium sucking member 7b are removed from intermediate substrate 100. When second sodium sucking member 7c is arranged as being in contact with the other main surface 10b of intermediate substrate 100, second sodium sucking member 7c is removed from intermediate substrate 100.

Then, surface protecting electrode 19 is formed to be in contact with source electrode 16 and to cover interlayer insulating film 21. Surface protecting electrode 19 is composed of a material preferably containing Al and it is made, for example, of AlSiCu. After surface protecting electrode 19 is formed, a lamp annealing step may be performed. In the lamp annealing step, silicon carbide substrate 10 provided with surface protecting electrode 19 may be heated, for example, for approximately 30 seconds at a temperature, for example, not lower than 700° C. and not higher than 800° C. Then, a passivation film forming step may be performed. The passivation film (not shown) is provided, for example, on surface protecting electrode 19. In the passivation film forming step, silicon carbide substrate 10 provided with surface protecting electrode 19 is heated, for example, for approximately 70 seconds at a temperature, for example, not lower than 400° C. and not higher than 450° C. Then, a sintering treatment step may be performed. In the sintering treatment step, silicon carbide substrate 10 provided with the passivation film is heated, for example, for approximately 15 minutes at a temperature approximately not lower than 350° C. and not higher than 450° C.

Then, drain electrode 20 composed, for example, of NiSi is formed as being in contact with second main surface 10b of silicon carbide substrate 10. Drain electrode 20 may be composed, for example, of TiAlSi. Though drain electrode 20 is preferably formed through sputtering, it may be formed through vapor deposition. After drain electrode 20 is formed, drain electrode 20 is heated, for example, through laser annealing. At least a part of drain electrode 20 is thus silicided and drain electrode 20 in ohmic contact with silicon carbide single-crystal substrate 11 is formed. Then, backside protecting electrode 23 is formed as being in contact with drain electrode 20. Backside protecting electrode 23 is composed of a material preferably containing Al. MOSFET 1 shown in FIG. 1 is manufactured as above.

In the method for manufacturing MOSFET 1 according to the present embodiment, in a step after the alloying annealing step, a temperature and a time period for heat treatment of intermediate structure 100 including source electrode 16, gate electrode 27, gate insulating film 15, interlayer insulating film 21, and silicon carbide substrate 10 are controlled as follows.

Specifically, a temperature and a time period for heat treatment of gate electrode 27 and interlayer insulating film 21 after the step of annealing the source electrode (including the step of annealing the source electrode) are controlled such that a condition of $N_0 \times L_T/x < 1.52 \times 10^{20}$ is satisfied, where $L_T$ (nm) represents a diffusion length of sodium, x (nm) represents a distance from surface 21c of interlayer insulating film 21 opposite to the third main surface of gate electrode 27 in a direction along direction of normal Y to first interface 15a to first interface 15a, and $N_0$ (cm$^{-3}$) represents a concentration of sodium in surface 21c of interlayer insulating film 21. Preferably, $N_0 \times L_T/x$ is smaller than $1.52 \times 10^{20} \times 0.85$ and more preferably smaller than $1.52 \times 10^{20} \times 0.70$.

For example, a case is assumed that the alloying annealing step (that is, the step of annealing the source electrode), the lamp annealing step, the sintering treatment step, and the passivation film forming step are performed on intermediate structure 100 including gate electrode 27 and interlayer insulating film 21. In the alloying annealing step, intermediate structure 100 is subjected to heat treatment for 15 minutes at a temperature of 1000° C. In the lamp annealing step, intermediate structure 100 is subjected to heat treatment for 30 seconds at a temperature of 740° C. In the sintering treatment step, intermediate structure 100 is subjected to heat treatment for 15 minutes at a temperature of 400° C. In the passivation film forming step, intermediate structure 100 is subjected to heat treatment for 70 seconds at a temperature of 420° C. When a heat treatment step in which intermediate structure 100 is exposed to a temperature not lower than 300° C. which is a high temperature exceeding heat resistance of a resist is added, a total diffusion length $L_T$ of sodium is calculated with a diffusion length in the heat treatment step being added.

Diffusion length $L_T$ of sodium into the gate electrode in the heat treatment step after the alloying annealing step is calculated as $L_T = L_A + L_L + L_S + L_P$. Here, $L_A$ represents a diffusion length of sodium in the alloying annealing step, $L_L$ represents a diffusion length of sodium in the lamp annealing step, $L_S$ represents a diffusion length of sodium in the sintering treatment step, and $L_P$ represents a diffusion length of sodium in the passivation film forming step.

Diffusion length L is calculated in a first expression below, where D represents a diffusion coefficient and t represents a heat treatment time period (second).

$$L = 2\sqrt{D \cdot t}$$

Diffusion coefficient D is calculated in a second expression below, where $D_0$ represents a diffusion constant (m²/second), Q represents activation energy (kJ/mol), R represents a gas constant 8.31 (J/mol·K), and T represents a heat treatment temperature (K).

$$D = D_0 \cdot \exp\left(-\frac{Q}{RT}\right)$$

Diffusion constant $D_0$ of sodium into gate electrode 27 composed of polysilicon is $1 \times 10^{-6}$ (cm²/second), and activation energy Q is 122 (kJ/mol). Diffusion coefficient D is calculated by substituting diffusion constant Do, activation energy Q, and heat treatment temperature T in the second expression above. The diffusion coefficient in the alloying annealing step (1000° C.) is calculated as $9.80 \times 10^{-12}$ (m²/second), the diffusion coefficient in the lamp annealing step (740° C.) is calculated as $5.08 \times 10^{-13}$ (m²/second), the diffusion coefficient in the passivation forming step (420° C.) is calculated as $6.30 \times 10^{-16}$ (m²/second), and the diffusion coefficient in the sintering treatment step (400° C.) is calculated as $3.36 \times 10^{-16}$ (m²/second).

Diffusion length L is calculated by substituting diffusion coefficient D and heat treatment time period t in the first expression above. Diffusion length $L_A$ in the alloying annealing step (900 seconds) is calculated as 187871 nm, diffusion length $L_L$ in the lamp annealing step (30 seconds) is calculated as 7808 nm, diffusion length $L_P$ in the passivation forming step (70 seconds) is calculated as 1100 nm, and diffusion length $L_S$ in the sintering treatment step (900 seconds) is calculated as 420 nm. Total diffusion length $L_T$ of sodium is calculated as 187871 nm+7808 nm+1100 nm+420 nm=197199 nm.

Here, a concentration of sodium $N_L$ is defined as $N_L = N_0 \times L_T / x$ (a third expression). Here, distance x represents a distance from surface 21c of interlayer insulating film 21 opposite to third main surface 27a of gate electrode 27 to first interface 15a in the direction along direction of normal Y to first interface 15a. In other words, distance x represents the sum of a thickness of interlayer insulating film 21 and a thickness of gate insulating film 15. When interlayer insulating film 21 has a thickness of 1000 nm and gate insulating film 15 has a thickness of 300 nm, distance x is calculated as 1300 nm. Concentration of sodium $N_0$ represents a concentration of sodium in surface 21c of interlayer insulating film 21 before alloying annealing is performed. Concentration of sodium $N_0$ is, for example, $1 \times 10^{18}$ cm⁻³. Using distance x, concentration of sodium $N_0$, and total diffusion length $L_T$, a concentration of sodium $N_{L0}$ is calculated as $N_0 \times L_T / x = 1.52 \times 10^{20}$ cm⁻³.

Sodium adhering to surface 21c of interlayer insulating film 21 diffuses into gate electrode 27 through heat treatment. When a concentration of sodium in gate electrode 27 is not less than a certain value, fluctuation in threshold voltage significantly occurs. In other words, fluctuation in threshold voltage can effectively be suppressed by suppressing a concentration of sodium diffused into gate electrode 27 to be smaller than a certain value. Specifically, a heat treatment temperature and a heat treatment time period in the heat treatment step after the step of alloying annealing of source electrode 16 are controlled such that a condition of $N_L / N_{L0} < 1$ (a fourth expression) is satisfied. A condition of $N_0 \times L_T / x < N_{L0} = 1.52 \times 10^{20}$ is satisfied by substituting $N_L = N_0 \times L_T / x$ (the third expression) into $N_L / N_{L0} < 1$ (the fourth expression). Namely, if a heat treatment temperature and a heat treatment time period in the heat treatment step after the step of alloying annealing of source electrode 16 are controlled such that a condition of $N_0 \times L_T / x < 1.52 \times 10^{20}$ is satisfied, fluctuation in threshold voltage can effectively be suppressed in spite of diffusion of sodium into interlayer insulating film 21 and gate electrode 27. For example, when the alloying annealing step is performed for 300 seconds at a temperature of 1000° C. and the lamp annealing step is performed for 30 seconds at a temperature of 740° C., the total diffusion length of sodium into gate electrode 27 is calculated as 117796 nm. With distance x being defined as 1300 nm and concentration of sodium $N_0$ being defined as $1 \times 10^{18}$ cm⁻³, concentration of sodium $N_L$ is $9.06 \times 10^{19}$ cm⁻³. Namely, $N_L / N_{L0}$ is calculated as approximately 0.6.

In the embodiment above, a MOSFET in which the n-type and the p-type are interchanged may be employed. Though a planar MOSFET has been described above by way of example of the silicon carbide semiconductor device according to the present invention, the silicon carbide semiconductor device may be, for example, a trench MOSFET or an IGBT.

Surface 21c of intermediate substrate 100 in the description of FIGS. 15 to 25 in the embodiment above may face upward or downward in connection with a direction of gravity. Arrangement of each of sodium blocking member 7a, first sodium sucking member 7b, and second sodium sucking member 7b is determined with a position of surface 21c of intermediate substrate 100 being defined as the reference, and it is not varied depending on an orientation of surface 21c of intermediate substrate 100.

A function and effect of the MOSFET representing the silicon carbide semiconductor device according to the present embodiment will now be described.

According to MOSFET 1 according to the present embodiment, in the first stress test in which a gate voltage of −5 V is applied to gate electrode 27 for 100 hours at a temperature of 175° C., an absolute value of a difference between a first threshold voltage and a second threshold voltage is not more than 0.5 V, with a threshold voltage before the first stress test being defined as the first threshold voltage and a threshold voltage after the first stress test being defined as the second threshold voltage. Fluctuation in threshold voltage of MOSFET 1 can thus effectively be lessened.

According to MOSFET 1 according to the present embodiment, in the second stress test in which a gate voltage of −10 V is applied to gate electrode 27 for 100 hours at a temperature of 150° C., an absolute value of a difference between a third threshold voltage and a fourth threshold voltage is not more than 0.1 V, with a threshold voltage before the second stress test being defined as the third threshold voltage and a threshold voltage after the second stress test being defined as the fourth threshold voltage. Fluctuation in threshold voltage of MOSFET 1 can thus more effectively be lessened.

According to MOSFET 1 according to the present embodiment, with an interface between gate insulating film 15 and gate electrode 27 being defined as first interface 15a and a region facing first interface 15a in the interface between gate insulating film 15 and silicon carbide substrate 10 being defined as second interface 15b, a value calculated by dividing a total number of sodium contained in interface region R lying between first virtual surface 2a distant from first interface 15a toward gate electrode 27 by a thickness of gate insulating film 15 along a direction of normal to first interface 15a and second virtual surface 2b distant from second interface 15b toward silicon carbide substrate 10 by the thickness of gate insulating film 15 along the direction of normal to second interface 15b by an area of first interface 15a is not more than $5\times10^{10}$ atoms/cm$^2$. Fluctuation in threshold voltage of the MOSFET can thus more effectively be lessened.

According to MOSFET 1 according to the present embodiment, a maximal value of a concentration of sodium in a region within 10 nm from third main surface 27a of gate electrode 27 opposite to second interface 15b is greater than a maximal value of a concentration of sodium in interface region R, and the maximal value of the concentration of sodium in interface region R is not more than $1\times10^{16}$ atoms/cm$^3$. Thus, even when MOSFET 1 is manufactured in an environment high in concentration of sodium, MOSFET 1 small in amount of fluctuation in threshold voltage can be obtained.

MOSFET 1 according to the present embodiment further includes interlayer insulating film 21 covering third main surface 27a of gate electrode 27 opposite to second interface 15b and provided as being in contact with gate insulating film 15 and source electrode 16 in contact with first main surface 10a of silicon carbide substrate 10. A temperature and a time period for heat treatment carried out on gate electrode 27 and interlayer insulating film 21 after a step of annealing the source electrode are controlled such that a condition of $N_0 \times L_T/x < 1.52\times10^{20}$ is satisfied, where $L_T$ (nm) represents a diffusion length of sodium, x (nm) represents a distance from surface 21c of interlayer insulating film 21 opposite to third main surface 27a in a direction along direction of normal Y to first interface 15a to first interface 15a, and $N_0$ (cm$^{-3}$) represents a concentration of sodium in surface 21c of interlayer insulating film 21. Fluctuation in threshold voltage of MOSFET 1 can thus more effectively be lessened.

According to MOSFET 1 according to the present embodiment, a maximal value of a concentration of sodium in a region within 10 nm from second main surface 10b of silicon carbide substrate 10 is greater than the maximal value of the concentration of sodium in interface region R. Thus, fluctuation in threshold voltage of a silicon carbide semiconductor device can be lessened by keeping the concentration of sodium in interface region R low even in an environment high in concentration of sodium.

According to a method for manufacturing MOSFET 1 according to the present embodiment, intermediate substrate 100 including one main surface 21c and the other main surface 10b opposite to one main surface 21c is prepared. Sodium blocking member 7a is arranged as being in contact with one main surface 21c of intermediate substrate 100. Intermediate substrate 100 is annealed while sodium blocking member 7a is in contact with one main surface 21c. Sodium blocking member 7a is removed from one main surface 21c after the step of annealing intermediate substrate 100. Intermediate substrate 100 includes silicon carbide substrate 10 having first main surface 10a facing one main surface 21c and second main surface 10b opposite to first main surface 10a, which forms the other main surface 10b of intermediate substrate 100, gate insulating film 15 partially in contact with first main surface 10a of silicon carbide substrate 10, and source electrode 16 in contact with first main surface 10a exposed through gate insulating film 15. A diffusion length of sodium into sodium blocking member 7a is not greater than a diffusion length of sodium into silicon carbide. Sodium blocking member 7a can effectively block introduction of sodium from the outside into one main surface 21c of intermediate substrate 100. Therefore, since a concentration of sodium in interface region R can be kept low, fluctuation in threshold voltage of a silicon carbide semiconductor device can be lessened.

According to the method for manufacturing MOSFET 1 according to the present embodiment, sodium blocking member 7a includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium from the outside into one main surface 21c of intermediate substrate 100 can more effectively be blocked.

The method for manufacturing MOSFET 1 according to the present embodiment further includes the step of arranging intermediate substrate holding portion 4 facing the other main surface 10b of intermediate substrate 100. A diffusion length of sodium into intermediate substrate holding portion 4 is not greater than the diffusion length of sodium into silicon carbide. Intermediate substrate holding portion 4 can effectively block introduction of sodium into the other main surface 10b of intermediate substrate 100.

According to the method for manufacturing MOSFET 1 according to the present embodiment, intermediate substrate holding portion 4 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into the other main surface 10b of intermediate substrate 100 can more effectively be blocked.

The method for manufacturing MOSFET 1 according to the present embodiment further includes the step of arranging lid portion 6 being in contact with intermediate substrate holding portion 4 and covering sodium blocking member 7a. In the step of annealing intermediate substrate 100, intermediate substrate 100 is annealed while intermediate substrate 100 is arranged in a space surrounded by lid portion 6 and intermediate substrate holding portion 4. A diffusion length of sodium into lid portion 6 is not greater than the diffusion length of sodium into silicon carbide. Lid portion 6 can effectively block introduction of sodium into one main surface 21c of intermediate substrate 100.

According to the method for manufacturing MOSFET 1 according to the present embodiment, lid portion 6 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into one main surface 21c of intermediate substrate 100 can more effectively be blocked.

According to a method for manufacturing MOSFET 1 according to the present embodiment, intermediate substrate 100 including one main surface 21c and the other main surface 10b opposite to one main surface 21c is prepared. First sodium sucking member 7b is arranged as being in contact with one main surface 21c of intermediate substrate 100. Intermediate substrate 100 is annealed while first sodium sucking member 7b is in contact with one main surface 21c. First sodium sucking member 7b is removed from one main surface 21c after the step of annealing intermediate substrate 100. Intermediate substrate 100 includes silicon carbide substrate 10 having first main surface 10a facing one main surface 21c and second main surface 10b opposite to first main surface 10a, which forms the other main surface 10b of intermediate substrate 100, gate insulating film 15 partially in contact with first main surface 10a of silicon carbide substrate 10, and source electrode 16 in contact with first main surface 10a exposed through gate insulating film 15. A diffusion length of sodium into first sodium sucking member 7b is greater than a diffusion length of sodium into silicon carbide. Therefore, even when one main surface 21c of intermediate substrate 100 is contaminated with sodium, first sodium sucking member 7b sucks sodium on one main surface 21c of intermediate substrate 100 so that a concentration of sodium on one main surface 21c of intermediate substrate 100 can effectively be lowered. Therefore, since a concentration of sodium in interface region R can be kept low, fluctuation in threshold voltage of a silicon carbide semiconductor device can be lessened.

According to the method for manufacturing MOSFET 1 according to the present embodiment, first sodium sucking member 7b includes at least one selected from the group consisting of a silicon layer, a silicon dioxide layer, a layer in which a silicon layer is coated with a silicon dioxide layer, and a layer in which a silicon dioxide layer is coated with a silicon layer. Thus, sodium on one main surface 21c of intermediate substrate 100 can more effectively be sucked.

According to the method for manufacturing MOSFET 1 according to the present embodiment, in a cross-sectional view, first sodium sucking member 7b has a thickness not smaller than 300 μm. Sodium on one main surface 21c of intermediate substrate 100 can thus more effectively be sucked.

The method for manufacturing MOSFET 1 according to the present embodiment further includes the steps of arranging second sodium sucking member 7c as being in contact with the other main surface 10b of intermediate substrate 100 before the step of annealing intermediate substrate 100 and removing second sodium sucking member 7c from the other main surface 10b after the step of annealing intermediate substrate 100. In the step of annealing intermediate substrate 100, intermediate substrate 100 is annealed while first sodium sucking member 7b is in contact with one main surface 21c of intermediate substrate 100 and second sodium sucking member 7c is in contact with the other main surface 10b of intermediate substrate 100. A diffusion length of sodium into second sodium sucking member 7c is greater than the diffusion length of sodium into silicon carbide. Second sodium sucking member 7c can effectively suck sodium on the other main surface 10b of intermediate substrate 100.

The method for manufacturing MOSFET 1 according to the present embodiment further includes the step of arranging intermediate substrate holding portion 4 facing the other main surface 10b of intermediate substrate 100. A diffusion length of sodium into intermediate substrate holding portion 4 is not greater than the diffusion length of sodium into silicon carbide. Intermediate substrate holding portion 4 can effectively block introduction of sodium into the other main surface 10b of intermediate substrate 100.

According to the method for manufacturing MOSFET 1 according to the present embodiment, intermediate substrate holding portion 4 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into the other main surface 10b of intermediate substrate 100 can more effectively be blocked.

The method for manufacturing MOSFET 1 according to the present embodiment further includes the step of arranging lid portion 6 being in contact with intermediate substrate holding portion 4 and covering first sodium sucking member 7b. In the step of annealing intermediate substrate 100, intermediate substrate 100 is annealed while intermediate substrate 100 is arranged in a space surrounded by lid portion 6 and intermediate substrate holding portion 4. A diffusion length of sodium into lid portion 6 is not greater than the diffusion length of sodium into silicon carbide. Lid portion 6 can effectively block introduction of sodium into one main surface 21c of intermediate substrate 100.

According to the method for manufacturing MOSFET 1 according to the present embodiment, lid portion 6 includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into one main surface 21c of intermediate substrate 100 can more effectively be blocked.

According to the method for manufacturing MOSFET 1 according to the present embodiment, first sodium sucking member 7b includes fourth main surface 7b2 in contact with one main surface 21c and fifth main surface 7b1 opposite to fourth main surface 7b2. The method further includes the steps of arranging sodium blocking member 7a in contact with fifth main surface 7b1 of first sodium sucking member 7b and removing sodium blocking member 7a from intermediate substrate 100 after the step of annealing intermediate substrate 100. In the step of annealing intermediate substrate 100, intermediate substrate 100 is annealed while sodium blocking member 7a is in contact with fifth main surface 7b1 of first sodium sucking member 7b and fourth main surface 7b2 of first sodium sucking member 7b is in contact with one main surface 21c of intermediate substrate 100. A diffusion length of sodium into sodium blocking member 7a is not greater than the diffusion length of sodium into silicon carbide. Sodium blocking member 7a can more effectively block introduction of sodium into one main surface 21c of intermediate substrate 100.

According to the method for manufacturing MOSFET 1 according to the present embodiment, sodium blocking member 7a includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer. Thus, introduction of sodium into one main surface 21c of intermediate substrate 100 can more effectively be blocked.

EXAMPLES

1. Preparation of Samples

Figure 10:
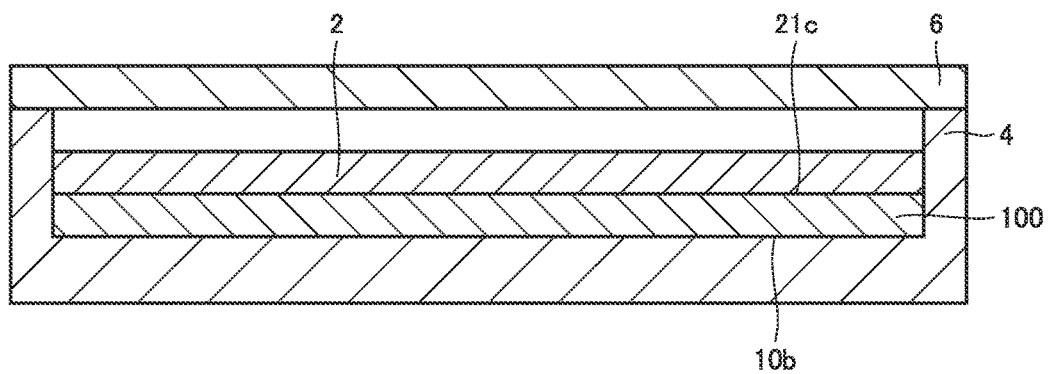
FIG. 10 is a schematic cross-sectional view for schematically illustrating a fifth step in the method for manufacturing a silicon carbide semiconductor device according to one embodiment of the present invention.

In the present example, relation between the total number of Na in interface region R of MOSFET 1 and an amount of fluctuation in threshold voltage was examined. Initially, MOSFETs 1 associated with samples 1 to sample 6 were fabricated with a method the same as the method described in the embodiment above except for conditions below. As shown in FIGS. 10 and 11, before the alloying annealing step is performed, silicon carbide substrate 10 provided with interlayer insulating film 21, gate electrode 27, gate insulating film 15, and source electrode 16 (intermediate structure 100) was arranged in tray 4. In a process for manufacturing sample 1, the tray was made of carbon and cover member 2 composed of silicon carbide was provided as being in contact with interlayer insulating film 21 of intermediate structure 100. In a process for manufacturing sample 2, the tray was made of carbon and cover member 2 covering intermediate structure 100 was not provided. In a process for manufacturing sample 3, alloying annealing was performed twice, the tray in first alloying annealing was made of silicon carbide, the tray in second alloying annealing was made of carbon, and cover member 2 covering intermediate structure 100 was not provided in first and second alloying annealing. In a process for manufacturing sample 4, the tray was made of carbon and cover member 2 composed of silicon carbide was provided as being in contact with interlayer insulating film 21 of intermediate structure 100. In a process for manufacturing sample 5, as shown in FIG. 22, first sodium sucking member 7b composed of silicon was provided as being in contact with one main surface 21c of intermediate structure 100, intermediate structure 100 and first sodium sucking member 7b were arranged in tray 4 made of carbon, and lid portion 6 made of carbon was arranged to cover first sodium sucking member 7b. In a process for manufacturing sample 6, as shown in FIG. 23, first sodium sucking member 7b composed of silicon was provided as being in contact with one main surface 21c of intermediate structure 100, second sodium sucking member 7c composed of silicon was provided as being in contact with the other main surface 10b, intermediate structure 100, first sodium sucking member 7b, and second sodium sucking member 7c were arranged in tray 4 made of carbon, and lid portion 6 made of carbon was arranged to cover first sodium sucking member 7b. Three samples 5 and three samples 6 were prepared.

Then, sample 1 to sample 6 were subjected to the alloying annealing step. In the step of alloying annealing of sample 1 and sample 4, alloying annealing was carried out while cover member 2 composed of silicon carbide was in contact with interlayer insulating film 21 of intermediate structure 100. In the step of alloying annealing of sample 5 and sample 6, alloying annealing was carried out while first sodium sucking member 7b composed of silicon was in contact with interlayer insulating film 21 of intermediate structure 100. In the step of alloying annealing of sample 2 and sample 3, alloying annealing was carried out while cover member 2 composed of silicon carbide was not provided and interlayer insulating film 21 and source electrode 16 were not covered with cover member 2. After the alloying annealing step, sample 2 and sample 3 were subjected to the lamp annealing step and the sintering treatment step. In the lamp annealing step, intermediate structure 100 was heated for 30 seconds at a temperature of 740° C. In the sintering treatment step, intermediate structure 100 was heated for 15 minutes at a temperature of 400° C. Sample 1, sample 4, sample 5, and sample 6 were not subjected to the lamp annealing step and the sintering treatment step. More specifically, a temperature and a time period for heat treatment on intermediate structure 100 including gate electrode 27 and interlayer insulating film 21 were controlled in sample 2 and sample 3 such that $N_0 \times L_T/x$ was not smaller than $1.52 \times 10^{20}$ in the heat treatment step after alloying annealing. A temperature and a time period for heat treatment on intermediate structure 100 including gate electrode 27 and interlayer insulating film 21 were controlled in sample 1 and sample 4 such that $N_0 \times L_T/x$ was smaller than $1.52 \times 10^{20}$ in the heat treatment step after alloying annealing. Though sample 1 was manufactured under manufacturing conditions substantially the same as those for sample 4, a different apparatus was employed in a majority of manufacturing processes.

Figure 13:
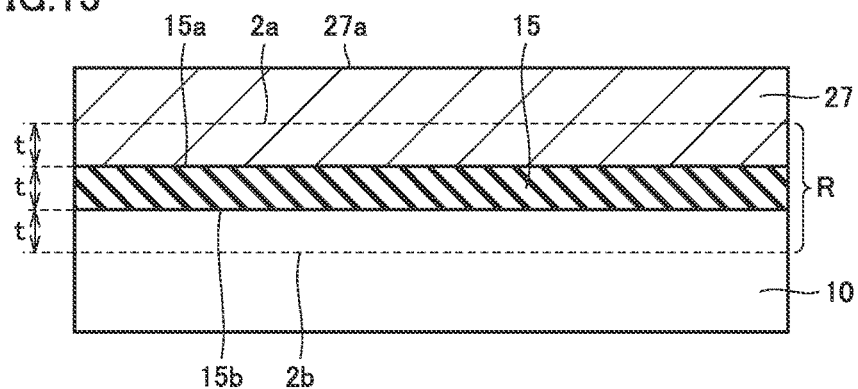
FIG. 13 is a schematic cross-sectional view for schematically illustrating a construction of a test element group (TEG) for measuring a concentration of sodium.

A TEG shown in FIG. 13 was formed on a wafer the same as the wafer where the MOSFET associated with each of sample 1 to sample 6 was formed. The TEG was fabricated for counting the total number of sodium in the interface region. As shown in FIG. 13, a silicon dioxide film 15 was provided on silicon carbide substrate 10 and polysilicon 27 was provided on the silicon dioxide film. Silicon dioxide film 15 corresponds to gate insulating film 15 of MOSFET 1 and polysilicon 27 corresponds to gate electrode 27 of MOSFET 1. A thickness of gate insulating film 15 was set to 45 nm and a thickness of polysilicon 27 was set to 300 nm.

2. Experiment

Amounts of fluctuation in threshold voltage of MOSFETs 1 associated with sample 1 to sample 6 were measured. Specifically, initially, a first threshold voltage before application of gate bias stress to gate electrode 27 of MOSFET 1 associated with each of sample 1 to sample 6 was measured. Definition of the threshold voltage is as described in the embodiment. Then, gate bias stress was applied to MOSFETs 1 associated with sample 1 to sample 6. A gate voltage of −5 V was applied as gate bias stress to gate electrode 27 for 100 hours at a temperature of 175° C. After application of gate bias stress, a second threshold voltage was measured. An amount of fluctuation in threshold voltage was calculated by subtracting the second threshold voltage from the first threshold voltage. Similarly, a third threshold voltage before application of gate bias stress to gate electrode 27 of each of MOSFETs 1 associated with sample 1 to sample 6 was measured. Thereafter, a gate voltage of −10 V was applied to gate electrode 27 for 100 hours at a temperature of 150° C. After application of gate bias stress, a fourth threshold voltage was measured. An amount of fluctuation in threshold voltage was calculated by subtracting the fourth threshold voltage from the third threshold voltage.

A concentration of sodium was measured by using the TEGs associated with sample 1 to sample 6. A concentration of sodium was measured with SIMS while the TEG is dug from surface 27a of polysilicon 27 toward silicon carbide substrate 10. A concentration of sodium was integrated from a position distant by a thickness of silicon dioxide film 15 (45 nm) from first interface 15a between polysilicon 27 and silicon dioxide film 15 toward surface 27a of polysilicon 27, to a position distant by a thickness of silicon dioxide film 15 (45 nm) from second interface 15b between silicon dioxide film 15 and silicon carbide substrate 10 toward silicon carbide substrate 10, to thereby calculate the total number of sodium atoms in interface region R. Similarly, a concentration of iron, a concentration of nitrogen, a concentration of phosphorus, and a concentration of hydrogen in interface region R were also measured.

3. Results

Relation between a concentration of sodium and a depth from a polysilicon surface will be described with reference to FIG. 14. For sample 1 to sample 3, a position 0 on the abscissa in FIG. 14 corresponds to surface 27a of polysilicon 27, and for sample 4, a position a on the abscissa in FIG. 14 corresponds to surface 27a of polysilicon 27. For each of sample 1 to sample 4, a position 0.3 on the abscissa in FIG. 14 corresponds to second interface 15b between silicon dioxide film 15 and silicon carbide substrate 10. For sample 5 and sample 6, only a concentration of sodium is shown in Tables 2 and 3 and a concentration profile is not shown in FIG. 14.

Figure 14:
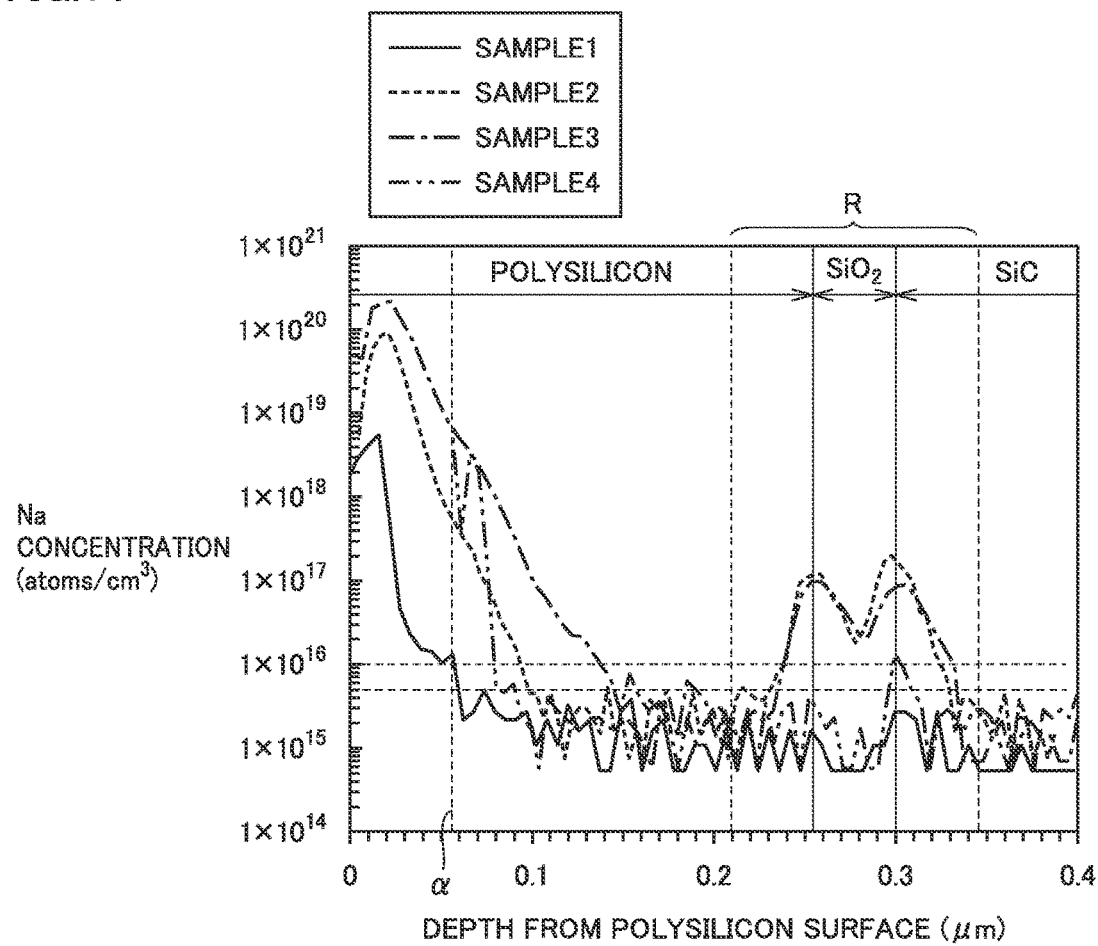
FIG. 14 is a diagram showing relation between a concentration of sodium and a depth from a polysilicon surface.

As shown in FIG. 14, in the TEG according to each of sample 2 and sample 3, an Na concentration was as high as approximately $1\times10^{17}$ atoms/cm$^3$ or more around first interface 15a between silicon dioxide film 15 and polysilicon 27 and around second interface 15b between silicon dioxide film 15 and silicon carbide substrate 10. In the TEG associated with sample 1, a maximal value of an Na concentration in interface region R was as low as approximately $1\times10^{16}$ atoms/cm$^3$ or less. In the TEG of each of sample 1 to sample 4, a maximal value of an Na concentration in a region within 10 nm from surface 27a of polysilicon 27 exhibited a high value approximately not smaller than $1\times10^{18}$ atoms/cm$^3$. In the TEG of each of sample 1 to sample 4, a great difference was not observed in concentration of each of iron, nitrogen, phosphorus, and hydrogen representing impurities other than sodium.

The first threshold voltage, the second threshold voltage, and an amount of fluctuation in threshold voltage will be described with reference to Table 2.

TABLE 2

| 175° C.-5 V | Total Number of Na [atoms/cm$^2$] | First Threshold Voltage [V] | Second Threshold Voltage [V] | Amount of Fluctuation [V] |
|---|---|---|---|---|
| Sample 1 | $6.3 \times 10^9$ | 1.69 | 1.68 | 0.01 |
| Sample 2 | $5.0 \times 10^{11}$ | — | — | — |
| Sample 3 | $6.9 \times 10^{11}$ | 1.84 | −0.5 | 2.34 |
| Sample 4 | $2.0 \times 10^{10}$ | 1.49 | 1.36 | 0.13 |
| Difference Among Samples 1 to 4 | $1.4 \times 10^{10}$ | 0.2 | 0.32 | 0.12 |
| Sample 5-1 | $6.2 \times 10^9$ | 1.88 | 1.85 | 0.03 |
| Sample 5-2 | $1.2 \times 10^{10}$ | 1.62 | 1.59 | 0.03 |
| Sample 5-3 | $8.8 \times 10^9$ | 1.42 | 1.41 | 0.01 |
| Difference Among Samples 5 | $5.5 \times 10^9$ | — | — | 0.02 |
| Sample 6-1 | $3.3 \times 10^9$ | 1.90 | 1.90 | 0.00 |
| Sample 6-1 | $7.5 \times 10^9$ | 1.48 | 1.47 | 0.01 |
| Sample 6-1 | $4.8 \times 10^9$ | 1.69 | 1.68 | 0.01 |
| Difference Among Samples 6 | $4.2 \times 10^9$ | — | — | 0.01 |

As shown in Table 2, the second threshold voltage of the MOSFET according to each of sample 1 to sample 6 was lower than the first threshold voltage. Amounts of fluctuation in threshold voltage of the MOSFETs associated with sample 1, sample 4, sample 5, and sample 6 in which the total number of Na was not greater than $5\times10^{10}$ atoms/cm$^2$ were 0.01 V, 0.13 V, 0.01 to 0.03 V, and 0.00 to 0.01 V, respectively, and all were equal to or less than 0.5 V. An amount of fluctuation in threshold voltage of the MOSFET associated with sample 3 in which the total number of Na exceeded $5\times10^{10}$ atoms/cm$^2$ exhibited a value as high as 2.34 V. The second threshold voltage of the MOSFET associated with sample 3 had a negative value.

Relation between an amount of fluctuation in threshold voltage and the total number of Na in the interface region, of the MOSFET associated with each of samples 1, 4, 5, and 6 will be described with reference to FIG. 26.

Figure 26:
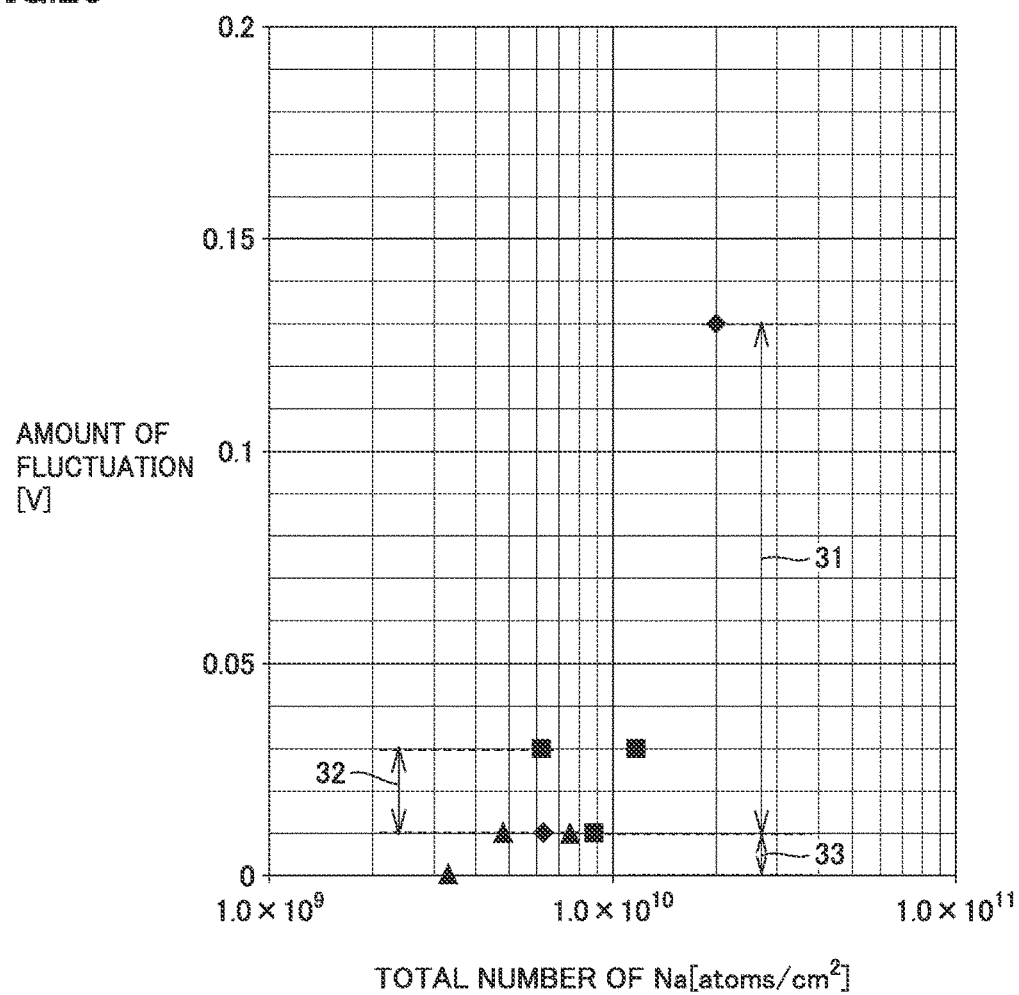
FIG. 26 is a diagram illustrating amounts of fluctuation in threshold voltage of MOSFETs associated with samples 1, 4, 5, and 6 under a condition of a temperature of 175° C. and a gate voltage of −5 V.

FIG. 26 shows a plot of samples 1, 4, 5, and 6 in Table 2, with the ordinate representing an amount of fluctuation in threshold voltage and the abscissa representing the total number of Na in interface region R. A rhombic mark represents samples 1 and 4, a square mark represents sample 5, and a triangular mark represents sample 6. Samples 1 and 4 were subjected to alloying annealing, with the cover member composed of silicon carbide (sodium blocking member) being used. Samples 5 and 6 were annealed, with the cover member composed of silicon (sodium sucking member) being used. Sample 5 had one surface covered and sample 6 had opposing surfaces covered.

As shown in Table 2 and FIG. 26, a difference (variation) in amount of fluctuation in threshold voltage of samples 1 and 4 was 0.12 V (a difference 31), whereas differences in amount of fluctuation in threshold voltage among three samples of sample 5 and among three samples of sample 6 were 0.02 V (a difference 32) and 0.01 V (a difference 33), respectively.

It was confirmed from the results above that, in applying a gate voltage of −5 V to the gate electrode for 100 hours at a temperature of 175° C., sample 5 in which the cover member composed of silicon was employed on one surface exhibited the total number of Na and the amount of fluctuation in threshold voltage comparable to those of samples 1 and 4 in which the cover member composed of silicon carbide was employed. It was also confirmed that use of the cover member composed of silicon on the opposing surfaces was smaller in total number of Na and amount of fluctuation in threshold voltage than use of the cover member composed of silicon on one surface and the cover member composed of silicon carbide. Furthermore, it was confirmed that samples 5 and 6 in which the cover member composed of silicon was employed were less in variation in amount of fluctuation in threshold voltage than samples 1 and 4 in which the cover member composed of silicon carbide was employed. It is estimated that samples 5 and 6 are more resistant to a factor for disturbance because Na is sucked by the cover member composed of silicon.

The third threshold voltage, the fourth threshold voltage, and an amount of fluctuation in threshold voltage will be described with reference to Table 3.

TABLE 3

| 150° C.-10 V | Total Number of Na [atoms/cm$^2$] | Third Threshold Voltage [V] | Fourth Threshold Voltage [V] | Amount of Fluctuation [V] |
|---|---|---|---|---|
| Sample 1 | $6.3 \times 10^9$ | 1.69 | 1.67 | 0.02 |
| Sample 2 | $5.0 \times 10^{11}$ | 1.99 | −0.56 | 2.55 |
| Sample 3 | $6.9 \times 10^{11}$ | 1.87 | −1.52 | 3.39 |
| Sample 4 | $2.0 \times 10^{10}$ | 1.49 | 1.39 | 0.10 |
| Difference Among Samples 1 to 4 | $1.4 \times 10^{10}$ | 0.2 | 0.28 | 0.08 |
| Sample 5-1 | $6.2 \times 10^9$ | 1.90 | 1.87 | 0.03 |
| Sample 5-2 | $9.1 \times 10^9$ | 1.62 | 1.58 | 0.04 |
| Sample 5-3 | $8.8 \times 10^9$ | 1.45 | 1.44 | 0.01 |
| Difference Among Samples 5 | $2.9 \times 10^9$ | — | — | 0.03 |
| Sample 6-1 | $3.3 \times 10^9$ | 1.92 | 1.92 | 0.00 |
| Sample 6-1 | $7.5 \times 10^9$ | 1.49 | 1.48 | 0.01 |
| Sample 6-1 | $4.8 \times 10^9$ | 1.72 | 1.71 | 0.01 |
| Difference Among Samples 6 | $4.2 \times 10^9$ | — | — | 0.01 |

As shown in Table 3, the fourth threshold voltage of the MOSFET according to each of sample 1 to sample 6 was lower than the third threshold voltage. Amounts of fluctuation in threshold voltage of MOSFETs associated with sample 1, sample 4, sample 5, and sample 6 of which total number of Na was not greater than $5\times10^{10}$ atoms/cm$^2$ were 0.02 V, 0.10 V, 0.01 to 0.04 V, and 0.00 to 0.01 V, respectively, and all were equal to or less than 0.1 V. Amounts of fluctuation in threshold voltage of the MOSFETs according to sample 2 and sample 3 in which the total number of Na exceeded $5\times10^{10}$ atoms/cm$^2$ exhibited values as high as 2.55 V and 3.39 V, respectively. The second threshold voltage of the MOSFETs associated with sample 2 and sample 3 had a negative value. Sample 1 was smaller in total number of Na and amount of fluctuation in threshold voltage than sample 4. Though sample 1 was manufactured under manufacturing conditions substantially the same as those for sample 4, a different apparatus was employed in a majority of manufacturing processes. Therefore, it is estimated that an amount of Na adhering to surface 21c of interlayer insulating film 21 was different and consequently an amount of fluctuation in threshold voltage was different.

Variation in amount of fluctuation in threshold voltage of the MOSFETs associated with samples 1, 4, 5, and 6 will be described with reference to FIG. 27.

FIG. 27 shows a plot of samples 1, 4, 5, and 6 in Table 3, with the ordinate representing an amount of fluctuation in threshold voltage and the abscissa representing the total number of Na in interface region R. A rhombic mark represents samples 1 and 4, a square mark represents sample 5, and a triangular mark represents sample 6. Samples 1 and 4 were subjected to alloying annealing, with the cover member composed of silicon carbide (sodium blocking member) being used. Samples 5 and 6 were annealed, with the cover member composed of silicon (sodium sucking member) being used. Sample 5 had one surface covered and sample 6 had opposing surfaces covered.

As shown in FIG. 27, a difference (variation) in amount of fluctuation in threshold voltage of samples 1 and 4 was 0.08 V (a difference 41), whereas differences in amount of fluctuation in threshold voltage among three samples of sample 5 and among three samples of sample 6 were 0.03 V (a difference 42) and 0.01 V (a difference 43), respectively.

It was confirmed from the results above that, in applying a gate voltage of −10 V to the gate electrode for 100 hours at a temperature of 150° C. as well, sample 5 in which the cover member composed of silicon was employed on one surface exhibited the total number of Na and the amount of fluctuation in threshold voltage comparable to those of samples 1 and 4 in which the cover member composed of silicon carbide was employed. It was also confirmed that use of the cover member composed of silicon on the opposing surfaces was smaller in total number of Na and amount of fluctuation in threshold voltage than use of the cover member composed of silicon on one surface and the cover member composed of silicon carbide. Furthermore, it was confirmed that samples 5 and 6 in which the cover member composed of silicon was employed were less in variation in amount of fluctuation in threshold voltage than samples 1 and 4 in which the cover member composed of silicon carbide was employed.

It was confirmed from the results above that MOSFET 1 of which total number of sodium in interface region R was not more than $5 \times 10^{10}$ atoms/cm$^2$ could achieve effective lessening in amount of fluctuation in threshold voltage.

It should be understood that the embodiment and the example disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 silicon carbide semiconductor device (MOSFET); 2 cover member; 2a first virtual surface; 2b second virtual surface; 4 intermediate substrate holding portion (tray); 5 silicon carbide epitaxial layer; 6 lid portion; 7a2 sixth main surface; 7a1 seventh main surface; 7a sodium blocking member; 7b2 fourth main surface; 7b first sodium sucking member; 7b1 fifth main surface; 7c second sodium sucking member; 10 silicon carbide substrate; 10a first main surface; 10b second main surface; 11 silicon carbide single-crystal substrate; 12 drift region; 13 body region; 14 source region; 15 gate insulating film (silicon dioxide film); 15a first interface; 15b second interface; 16 source electrode; 18 contact region; 19 surface protecting electrode; 20 drain electrode; 21 interlayer insulating film; 21a first insulating film; 21b second insulating film; 21c surface; 23 backside protecting electrode; 27 gate electrode (polysilicon); 27a third main surface (surface); 100 intermediate substrate (intermediate structure); R interface region; Y direction of normal; D diffusion coefficient; $D_0$ diffusion constant; L, $L_A$, $L_L$, $L_P$, $L_S$, $L_T$ diffusion length; $N_0$, $N_L$, $N_{L0}$ concentration of sodium; Q activation energy, a thickness; x distance; t heat treatment time period; and T heat treatment temperature.

The invention claimed is:

1. A method for manufacturing a silicon carbide semiconductor device, comprising the steps of:
preparing an intermediate substrate including one main surface and the other main surface opposite to the one main surface;
arranging a sodium blocking member as being in contact with the one main surface of the intermediate substrate;
annealing the intermediate substrate while the sodium blocking member is in contact with the one main surface; and
removing the sodium blocking member from the one main surface after the step of annealing the intermediate substrate,
the intermediate substrate including a silicon carbide substrate having a first main surface facing the one main surface and a second main surface opposite to the first main surface, which forms the other main surface of the intermediate substrate, a gate insulating film partially in contact with the first main surface of the silicon carbide substrate, and a source electrode in contact with the first main surface exposed through the gate insulating film, and
the sodium blocking member being composed of a material having a diffusion constant of sodium not greater than a diffusion constant of sodium into the silicon carbide substrate.

2. The method for manufacturing a silicon carbide semiconductor device according to claim 1, wherein
the sodium blocking member includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

3. The method for manufacturing a silicon carbide semiconductor device according to claim 1, further comprising the step of arranging an intermediate substrate holding portion facing the other main surface of the intermediate substrate, wherein
the intermediate substrate holding portion being composed of a material having a diffusion constant of sodium not greater than a diffusion constant of sodium into the silicon carbide substrate.

4. The method for manufacturing a silicon carbide semiconductor device according to claim 3, wherein
the intermediate substrate holding portion includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

5. The method for manufacturing a silicon carbide semiconductor device according to claim 3, further comprising the step of arranging a lid portion being in contact with the intermediate substrate holding portion and covering the sodium blocking member, wherein
in the step of annealing the intermediate substrate, the intermediate substrate is annealed while the intermediate substrate is arranged in a space surrounded by the lid portion and the intermediate substrate holding portion, and
the lid portion being composed of a material having a diffusion constant of sodium not greater than the diffusion constant of sodium into the silicon carbide substrate.

6. The method for manufacturing a silicon carbide semiconductor device according to claim 5, wherein
the lid portion includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

7. A method for manufacturing a silicon carbide semiconductor device, comprising the steps of:
preparing an intermediate substrate including one main surface and the other main surface opposite to the one main surface;
arranging a first sodium sucking member in contact with the one main surface of the intermediate substrate;
annealing the intermediate substrate while the first sodium sucking member is in contact with the one main surface; and
removing the first sodium sucking member from the one main surface after the step of annealing the intermediate substrate,
the intermediate substrate including a silicon carbide substrate having a first main surface facing the one main surface and a second main surface opposite to the first main surface, which forms the other main surface of the intermediate substrate, a gate insulating film partially in contact with the first main surface of the silicon carbide substrate, and a source electrode in contact with the first main surface exposed through the gate insulating film, and
the first sodium sucking member being composed of a material having a diffusion constant of sodium greater than a diffusion constant of sodium into the silicon carbide substrate.

8. The method for manufacturing a silicon carbide semiconductor device according to claim 7, wherein
the first sodium sucking member includes at least one selected from the group consisting of a silicon layer, a silicon dioxide layer, a layer in which a silicon layer is coated with a silicon dioxide layer, and a layer in which a silicon dioxide layer is coated with a silicon layer.

9. The method for manufacturing a silicon carbide semiconductor device according to claim 7, wherein
in a cross-sectional view, the first sodium sucking member has a thickness not smaller than 300 μm.

10. The method for manufacturing a silicon carbide semiconductor device according to claim 7, further comprising the steps of:
arranging a second sodium sucking member in contact with the other main surface of the intermediate substrate before the step of annealing the intermediate substrate; and
removing the second sodium sucking member from the other main surface after the step of annealing the intermediate substrate, wherein
in the step of annealing the intermediate substrate, the intermediate substrate is annealed while the first sodium sucking member is in contact with the one main surface of the intermediate substrate and the second sodium sucking member is in contact with the other main surface of the intermediate substrate, and
the second sodium sucking member being composed of a material having a diffusion constant of sodium greater than a diffusion constant of sodium into the silicon carbide substrate.

11. The method for manufacturing a silicon carbide semiconductor device according to claim 7, further comprising the step of arranging an intermediate substrate holding portion facing the other main surface of the intermediate substrate, wherein
the intermediate substrate holding portion being composed of a material having a diffusion constant of sodium not greater than a diffusion constant of sodium into the silicon carbide substrate.

12. The method for manufacturing a silicon carbide semiconductor device according to claim 11, wherein
the intermediate substrate holding portion includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

13. The method for manufacturing a silicon carbide semiconductor device according to claim 11, further comprising the step of arranging a lid portion being in contact with the intermediate substrate holding portion and covering the first sodium sucking member, wherein
in the step of annealing the intermediate substrate, the intermediate substrate is annealed while the intermediate substrate is arranged in a space surrounded by the lid portion and the intermediate substrate holding portion, and
the lid portion being composed of a material having a diffusion constant of sodium not greater than a diffusion constant of sodium into the silicon carbide substrate.

14. The method for manufacturing a silicon carbide semiconductor device according to claim 13, wherein
the lid portion includes at least one selected from the group consisting of a carbon layer, a silicon carbide layer, a tantalum carbide layer, a layer in which a silicon layer is coated with a silicon carbide layer, and a layer in which a carbon layer is coated with a silicon carbide layer.

15. The method for manufacturing a silicon carbide semiconductor device according to claim 7, wherein
the first sodium sucking member includes a fourth main surface in contact with the one main surface and a fifth main surface opposite to the fourth main surface,
the method further comprises the steps of:
arranging a sodium blocking member as being in contact with the fifth main surface of the first sodium sucking member; and removing the sodium blocking member from the intermediate substrate after the step of annealing the intermediate substrate, in the step of annealing the intermediate substrate, the intermediate substrate is annealed while the sodium blocking member is in contact with the fifth main surface of the first sodium sucking member and the fourth main surface of the first sodium sucking member is in contact with the one main surface of the intermediate substrate, and the sodium blocking member being composed of a material having a diffusion constant of sodium not greater than a diffusion constant of sodium into the silicon carbide substrate.

16. The method for manufacturing a silicon carbide semiconductor device according to claim 15, wherein the sodium blocking member includes at least one selected from the group consisting of a carbon layer, a silicon carbide layer, a tantalum carbide layer, a layer in which a silicon layer is coated with a silicon carbide layer, and a layer in which a carbon layer.

* * * * *